United States Patent
Cromarty et al.

(10) Patent No.: US 11,536,794 B1
(45) Date of Patent: *Dec. 27, 2022

(54) ACCURATE AND MODEL-BASED MEASUREMENT AND MANAGEMENT SYSTEMS AND METHODS

(71) Applicant: Heathkit Company, Inc., Santa Cruz, CA (US)

(72) Inventors: Andrew S. Cromarty, Palo Alto, CA (US); Donald J. Peterson, Santa Cruz, CA (US); Jasen Levoy, Santa Cruz, CA (US); William Charles Calhoun, Richland, WA (US)

(73) Assignee: HEATHKIT COMPANY, INC., Santa Cruz, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/214,721

(22) Filed: Mar. 26, 2021

Related U.S. Application Data

(63) Continuation of application No. 15/982,224, filed on May 17, 2018, now Pat. No. 10,962,623.

(Continued)

(51) Int. Cl.
*G01R 35/00* (2006.01)
*G01R 17/06* (2006.01)
(Continued)

(52) U.S. Cl.
CPC ........... *G01R 35/007* (2013.01); *G01R 17/06* (2013.01); *G01R 17/20* (2013.01); *G06N 5/045* (2013.01);
(Continued)

(58) Field of Classification Search
CPC ...... G01R 35/007; G01R 17/20; G01R 17/06; G06N 5/045; G01D 18/008; H03M 1/60; H03F 2200/261; H03F 3/387
(Continued)

(56) References Cited

U.S. PATENT DOCUMENTS 3,854,374 A  12/1974 Boyle et al.
4,229,733 A  10/1980 Tulenko et al.
(Continued)

*Primary Examiner* — Giovanni Astacio-Oquendo
(74) *Attorney, Agent, or Firm* — Squire Patton Boggs (US) LLP

(57) ABSTRACT

Systems and methods for measurement and management are disclosed that provide complex measurements cost-effectively at very high accuracy. These methods and systems in some cases achieve measurement accuracy exceeding the accuracy of the reference standards they rely on, and eliminate expensive and disadvantageous recalibration procedures. The accurate measurements are integrated with management functions, applying the measurement data to meet objectives of the integrated system and workflow goals of its user. The disclosed systems and methods comprise an explicit or expressly represented model both of themselves and of candidate external systems to be measured and managed. The models may be configured and reconfigured by the owner-user through either local or remote means. The system intelligently reconfigures itself to adapt dynamically to the conditions of measurement and the user's and system's goals at each moment. In an embodiment, the system includes high-accuracy and reconfigurable components including a meter or control head adapted for user precision assembly and maintenance that computes and displays or communicates the measurements, displaying measurements in desired units, grouping functions according to ergonomic and cognitive principles based on the activity and workflow of a user in relation to the internal model. The use of models permits the system to compute and provide complex and inferred measurements of ultimate interest to the user, including quantities that cannot be directed measured and only can be determined through reasoning or computation by applying models to raw measurement data. The precision-assembly modular electromechanical design further permits an owner-user to precisely assemble, maintain, (Continued)

modify the apparatus and calibrate the equipment for accuracy.

12 Claims, 11 Drawing Sheets

Related U.S. Application Data

(60) Provisional application No. 62/507,273, filed on May 17, 2017.

(51) Int. Cl.
*G06N 5/04* (2006.01)
*G01R 17/20* (2006.01)
*H03F 3/387* (2006.01)
*G01D 18/00* (2006.01)
*H03M 1/60* (2006.01)

(52) U.S. Cl.
CPC ............ *G01D 18/008* (2013.01); *H03F 3/387* (2013.01); *H03F 2200/261* (2013.01); *H03M 1/60* (2013.01)

(58) Field of Classification Search
USPC ................................ 324/600, 601, 605, 606
See application file for complete search history.

(56) References Cited

U.S. PATENT DOCUMENTS

| | | | |
|---|---|---|---|
| 4,502,028 | A | 2/1985 | Leake |
| 5,430,292 | A | 7/1995 | Honjo et al. |
| 5,495,558 | A | 2/1996 | Tashima et al. |
| 6,297,730 | B1 | 10/2001 | Dickinson et al. |
| 8,228,372 | B2 | 7/2012 | Griffin |
| 8,363,981 | B2 | 1/2013 | Tonomura |
| 8,620,852 | B1 | 12/2013 | Kipersztok et al. |
| 10,809,968 | B2 * | 10/2020 | Roblek .................. G06F 16/683 |
| 2003/0232599 | A1 | 12/2003 | Dostert et al. |
| 2004/0083454 | A1 | 4/2004 | Bigus et al. |
| 2006/0032743 | A1 | 2/2006 | Harima |
| 2006/0076503 | A1 | 4/2006 | Tsao |
| 2006/0273263 | A1 | 12/2006 | Raymond et al. |
| 2008/0212224 | A1 | 9/2008 | Evans et al. |
| 2009/0327205 | A1 | 12/2009 | Sweeney |
| 2013/0253837 | A1 | 9/2013 | Abitrabi et al. |
| 2015/0338255 | A1 | 11/2015 | Koba et al. |
| 2016/0177856 | A1 | 6/2016 | Martinez et al. |
| 2020/0333376 | A1 * | 10/2020 | Graf ...................... G01R 31/389 |
| 2020/0350641 | A1 * | 11/2020 | Lee ...................... H01M 10/482 |
| 2022/0155380 | A1 * | 5/2022 | Sung .................. G01R 31/3648 |
| 2022/0187266 | A1 * | 6/2022 | Dunn ..................... G08B 17/10 |
| 2022/0187385 | A1 * | 6/2022 | Laurent ................. G01B 21/32 |

\* cited by examiner

ACCURATE AND MODEL-BASED MEASUREMENT AND MANAGEMENT SYSTEMS AND METHODS

CROSS-REFERENCE TO RELATED APPLICATIONS

The present application is a continuation of U.S. patent application Ser. No. 15/982,224, filed May 16, 2018, which claims the benefit of U.S. Provisional Application Ser. No. 62/507,273, filed on May 17, 2017 Both of these applications are hereby incorporated by reference in their entirety. The disclosures of related U.S. Provisional Application Ser. No. 62/364,629, filed Jul. 20, 2016, entitled "Internet-of-Things Methods and Systems" and U.S. patent application Ser. No. 15/221,279 filed Jul. 27, 2016, entitled "Radio-Related Telecommunications Systems and Methods" are incorporated by reference herein in their entirety.

FIELD OF INVENTION

The present invention generally relates to systems and methods for measurement such as in electronics equipment, and more particularly, to high-accuracy and model-based measurement and management systems and methods.

BACKGROUND

Scientific and engineering measurements are characterized by the attributes of precision and accuracy. Precision is representational and is measured in the amount of displayed or recorded detail, such as in the number of decimal digits used to represent a measurement number. Accuracy defines the correctness of a measurement, and typically is either exact or provided as a range or tolerance within which a measurement is deemed correct. For example, a measurement reported as "100+/−5%" is not in error if the true value of the quantity being measured was 103 rather than 100. In general accuracy is prized highly and more than precision, and it is an error to report more precision than is supportable by the accuracy of a measurement.

An example of electronic measurement equipment in use today is Standing Wave Ratio (SWR) and power meters that measure SWR and power of radio frequency (RF) signals such as may be present in radio transmitters, be carried by a transmission line or other circuit, or be sent to or received from an antenna. High-quality non-laboratory grade equipment available today typically achieves measurement accuracy of approximately 5% to 7%. Laboratory grade equipment that can achieve superior accuracy of approximately 1% typically costs ten to one hundred times more. Generally to achieve and maintain accuracy, such devices must be factory-calibrated and then sealed against intrusion or adjustment by the owner-user. The manufacturer thus effectively may retain monopoly control over accuracy, preventing the user from recalibrating their own equipment and permitting the manufacturer to demand a very high market price both for the equipment and for any subsequent adjustment or recalibration.

Even if high accuracy is initially achieved at the time of manufacture, due to the laws of physics there is drift over time in physical characteristics, and thus the accuracy, of measurement equipment. This creates a requirement for recalibration, and also for certification of calibration. Such certifications have a lifespan over which they are valid, and then they must be performed again. Modern highly accurate laboratory-quality equipment and methods thus often require use of a calibration and certification procedure authorized by an industry or national certification authority. For example, in the United States, standards for such certifications are established by the National Institute of Standards and Technology (NIST) of the US Government, and recalibration following NIST methods must be performed at least every two years for the measurement system to be considered in calibration according to the standard. Typically this entails taking the equipment to be certified out of service, shipping it to a qualified laboratory where its error is measured and recorded, possible lab adjustment of the equipment until its measurements fall within the acceptable tolerance specifications for accuracy, and return of the equipment with a certification sheet confirming the accuracy of the device before and after it was calibrated. Thereafter the device is placed back in service by its user-owner. Such calibrations are expensive and time-consuming and cause the device to be unavailable for service for the duration of the certification process. Exemplary laboratory-grade measurement equipment routinely is advertised today on major manufacturer price sheets as costing thousands or tens of thousands of dollars, and a single recalibration and recertification by the manufacturer will be priced at 15% or more of the capital cost of the equipment. Thus the cost of ownership of such a measurement system over a decade can be roughly double the original purchase price due to recalibration and recertification fees alone. Even where laboratories other than the manufacturer are able to provide this service, they must own highly expensive high-accuracy equipment and can command a high price for their services, maintaining a market oligopoly that keeps the cost of accuracy high for the owner-user. It must be noted that this highly undesirable economics substantially results from the technical design flaws of modern measurement systems that provide no means for or even prevent owner-users performing their own reliable calibration to achieve and maintain high accuracy of their measurement systems.

Whether or not calibrated, existing measurement systems commonly are limited in their accuracy by non-fixed or nonlinear physical phenomena. For example, an SWR or RF power meter that achieves a stated accuracy at a specified frequency and power level will not provide that degree of measurement accuracy at other frequencies and power levels. To make their equipment useful under a wider range of conditions, manufacturers of existing equipment attempt to accommodate the inherent errors in their measurement systems by providing an error chart that documents for the user how inaccurate the equipment is under varying conditions. In essence these charts document the failure of the equipment to achieve its intended or stated measurement accuracy, and provide data according to which the owner-user may adapt the instrument's measurements to accommodate its design flaws and failings. For example, many modern measurement systems commonly have a printed table of correction factors taped or etched onto the outer surface of a device in the measurement system to inform the user how flawed the reported measurements are. The user then may perform arithmetic, or readjust the measurement equipment manually during each measurement activity, to account for the erroneous measurement data reported by the apparatus for the individual test conditions of that moment. If the measurement conditions change, for example entailing measurement at a different frequency, then a different correction factor (CF) must be calculated or dialed into the equipment at that moment to accommodate the inherent measurement error and inaccuracy of the equipment under the changed measurement conditions. This method is highly manual and is infeasible to apply under conditions of rapid change, such as when measuring SWR or power during an emergency, radio contest or other conditions wherein frequency is changed over a wide range on a moment-to-moment basis. It also is highly unsuitable for field operations, harsh environments, distributed and remote operations, and other common measurement situations that materially differ from working at a laboratory bench. Commercial recalibration of equipment today often correspondingly includes printing a paper correction chart and returning it with the calibrated equipment or, for some modern equipment, returning the correction factor chart to the owner-user in a digital format such as in an EEPROM. That is, the equipment is not corrected to provide fully accurately measurement data, but rather the equipment is returned from the calibration lab as inaccurate and its failure is quantified with an arithmetic correction factor. It is obvious that such a correction factor may be expressed as a list of points or as the parameters specifying an equivalent line, which are commonly known through simple algebra to be equivalent under assumptions of linearity. The assumption of linearity is used in existing equipment whether or not justified by the physics of the apparatus because it is easy, not because it is correct. A correct approach, yielding superior accuracy, would model the error measurements including their nonlinearity and/or according to the actual device physics.

Accuracy limitations in both modern equipment design and due to physics applies to sensors as well as meter equipment. In highly expensive electronic measurement systems today, for about the price of a new automobile, a user can buy a meter and sensor wherein the sensor component comprises a few cents worth of EEPROM memory that may contain empirical "correction factor" chart values or parameters. The sensor further may comprise associated electronics to sense frequency and temperature for the purpose of applying CF chart values or parameters to cause the sensor to report an adjusted value to any meter equipment to which the sensor is attached. Notably the sensor CF data are stored within the sensor. This approach restricts accuracy, utility, and effectiveness of the measurement equipment. For example, such electronics within the sensor must be regarded as fragile. Generally power must be supplied to the sensor's internal electronics to allow it to operate, preventing the sensor from conveniently working in harsh environments or a long distance from the meter component of the measurement system such as at the top of an antenna tower during an ice storm. The sensor also must be removed from service and resubmitted to a laboratory service for periodic recertification and its EEPROM contents updated to reflect sensor changes that have arisen due to drift over time and effects of its operating environment. Removing an in-service sensor can be highly impractical, expensive, or onerous if the sensor is in a harsh or unreachable environment, such as in a remote mountaintop radio repeater system or mounted several hundred feet above ground. These design factors limit the robustness and usefulness of such measurement equipment.

Mathematical, computational, and artificial intelligence models generally comprise descriptions of systems and methods. For example, a mathematical model can be defined as a mathematical "system" (i.e. collection) of equations, such as a system of linear equations or a system of nonlinear simultaneous differential equations. An artificial intelligence model may be embodied using a computable representation such as one of frames, cases, databases, forward- and backward-chaining rulesets and propositions, property lists, association lists, theorem prover representations, taxonomic tree structures, semantic network lattices or digraphs, and symbolic form. Computational models can capture and represent both the input-output relationships of computations to be performed and the applicable conditions and expected performance they provide. Models may be dynamic, that is time-varying. Dynamic mathematical models may be represented using either discrete or continuous mathematics, and may be implemented using discrete-time or continuous-time computation, for example, using difference equations or differential equations respectively. Models may be designed for simple replicative validity, or better for predictive validity, or most preferentially for structural validity wherein proper modeling of structure permits development of structurally-valid forecasts of true-world behavior even before it is observed. Models may capture and represent both structure and function, and both the qualitative and quantitative aspects, of the system or phenomena they model. They may be dynamic, capable of being changed or of changing and improving themselves through learning or other mechanisms both as to accuracy and performance and as to breadth of coverage. However, although such sophisticated models are known to varying degrees in fields such as numerical simulation, single-circuit simulation, and artificial intelligence, they are not employed in achieving high-accuracy electronic measurement systems.

Expensive modern measurement systems may offer multiple input or sensor "channels" permitting multiple independent sensors to be attached to the meter component and their recorded data to be viewed. However, existing manufacturers have failed to recognize that independence of the sensors is a restriction rather than a benefit. Often there are multiple places in one circuit or system under test where measurement points are appropriate, and particularly among which a comparison may be desired or required. In such circumstances the multiple independent measurements must be taken and recorded and then the user must manually perform the desired comparison or computation. Certain restricted classes of equipment, such as Vector Network Analyzers (VNAs), permit highly stylized and restricted "port"-based comparison of two different locations in a circuit. However these analyzers, and all measurement systems generally, comprise no explicit, variable, or user-definable internal model of the circuit being tested. Rather by design such systems impose a single implicit understanding or small restricted set of understandings of circuits on the user, such as that the quantity of interest is voltage difference or phase difference that may be measured across a simple bridge circuit or its equivalent. The opportunity for computing comparison measurements is correspondingly restricted, because the knowledge of the structure of the circuit under equipment under test is known to a human experimenter or technician but unknown and unknowable by the equipment, which comprises no means of expressing, modifying, or computing over an explicit model of the circuit under test.

As one illustrative example of a model, a radio transmission system generally comprises a transmitter or "exciter" creating a radio frequency (RF) output signal, a power amplifier, an antenna "tuner" and/or "balun" or other impedance matching transformer, an optional "dummy load" device for receiving and dissipating the transmitter's energy during test periods, one or more transmission lines, and one or more antennas. This human model-knowledge of the organization of a radio transmission system is held in the minds of users of such transmission systems, but is nowhere present in express form the measurement system apparatus used today to measure and manage them. Instead the user must extract individual arcane numbers from the measurement apparatus, then outside that measurement system apply their personal human model knowledge of the transmission system to compute manually the quantities of ultimate interest, such as overall system efficiency or other performance measures that help the user understand, characterize, diagnose, and improve the overall transmission system and each of its components. This is also true when the measurement system apparatus is integrated or incorporated as one of the transmission system components. For example, SWR and RF power meter and sensor apparatus are variously provided within exciters or antenna tuners, but no express model knowledge of connected components of the transmission system is provided or used, limiting the kind of measurements that may be reported to the user. Instead of informing the user directly about its overall performance or the comparative behavior of its constituent parts and how they interact to produce that overall performance, the measurements they produce only provide limited, basic data about that single test point in the transmission system. This is an essential failing of today's measurement systems. Owner-users of equipment they measure, such as transmission systems, want and need to understand whole-system performance, to know how to optimize characteristics and behavior of individual components that interact with each other, and to compute derived system-level quantities such as component efficiency, system efficiency, and Effective Radiated Power (ERP) that only can be determined by applying a system model to the raw data modern measurement systems provide, often requiring sensor readings from multiple test points. Today's measurements systems, containing no such model knowledge, cannot perform these analyses.

A solution to the longstanding need for better measurement and management further must provide an effective, informative, and intuitive user interface. Today most measurement systems have a few panel buttons, with many more of the measurement system's actions and options buried out of view in nested menus. Such systems are designed for the convenience of the manufacturer rather than to meet the cognitive needs of the owner-user. Such designs require a large number of button presses and scrolling around in menus and tedious "hunting" for a desired action or setting, or else provide only a handful of useful measurement functions. A better-designed system would provide a logically-organized collection of actions, such as in the form of front panel buttons or speech commands, that allow the user to quickly identify and activate the most-needed methods of the measurement system with immediacy and no confusion. Further, the cognitive organization of the user interface should sensibly and dynamically provide all, but only, the choices of actions, measurement units, and indications that make sense for the measurement activity currently under way. A model of the external system under analysis, stored and operable within the measurement system, could provide the context required for dynamic reconfiguration of the user interface to present always-meaningful choices, units, options, actions, alerts, status, configuration choices, and measurement data. The owner-user further must be able to provide, modify, and update model data and external system data using the measurement and management system's interface, whether such adaptations are provided via interaction with human-accessible display meter apparatus or via remote or networked tools that deliver and modify model and system data of the measurement management apparatus.

It will be understood that generally measurement comprises collecting or inferring data, and management comprises using data and goals to manipulate a system's effectors toward some objective or output result. These functions often interact and may be beneficially integrated into a single system in a coherent way. For example, a radio system antenna tuner is a device that serves as an impedance transformer between a radio transmitter and an antenna transmission line and attached antenna. It is common for an antenna tuner to have integrated measurement and management interface. The Heathkit SA-2060A and Heathkit SA-2500 antenna tuners are exemplary systems that comprise apparatus to measure and display SWR and forward and reflected RF power at the point where the tuner is inserted into a transmission line circuit. They also comprise manual or automatic capacitor and coil adjustment apparatus for managing and optimizing the impedance match between a transmitter and its transmission line and antenna. The antenna tuner system's management method depends essentially on the measurements the system makes on a continuous basis, so that measurement and management are interdependent. The SA-2060A permits a human to view the measurements on displays and apply those measurement data dynamically to manage and maintain the desired impedance match through manual interaction with its electromechanical front panel control interface. The SA-2500 comprises additional electronics to automatically adjust or "tune" its own components to maximize or minimize a criterion such as SWR that is dynamically measured by its integral measurement apparatus. Neither system comprises a model of itself or is capable of augmenting its own behavior through experience or use; nor do other antenna tuner systems or other measurement-management systems in the art today comprise such express models and capabilities.

Existing measurement system display methods and systems have significant cognitive limitations in their display of time-varying and scale data and their organization of user interaction that include limited-resolution simulated bar-graphs such as may be painted onto an LCD display's pixels, numerical digital display of inherently analog measurements, poor display color contrast that limits rapid cognitive grasp of underlying measurement data, failure to group logically related functions in cognitively meaningful clusters associated with function and workflow, and inability to simultaneously present data as analog and digital to obtain the cognitive benefits of each format in a unified display. Further, current equipment provides for alerts in the form of a beeper, alarm or flashing a light when a simple direct-measured condition is exceeded, such as high SWR. This is only minimally helpful, since it is unable to distinguish expected vs. unexpected cases of a threshold being exceeded. For example, it is normal to have an initial SWR mismatch when a radio transmitter is used with an antenna designed for a different resonant frequency while tuning, but abnormal and potentially harmful to have the same measured SWR value when the system is believed to be tuned for proper operation. In essence the alert tells the owner-user what is already known to them and cannot distinguish meaningful from meaningless measurement data. This alerting failure results from the lack of a model of the equipment and its moment-to-moment intended usage.

There thus is a need for measurement systems that cost-effectively and accurately compute the measurements of ultimate interest to the measurement system user. In one aspect, these measurements can be integrated with management functions that apply the measurement data to meet goals defined by either the system or its user.

There is a need for measurement systems that comprise an explicit or expressly represented model of themselves and of candidate external systems to be measured, and further wherein the model may be configured and reconfigured by the owner-user, and which apparatus intelligently reconfigures itself to adapt dynamically to the conditions of measurement and the user's and system's goals at each moment.

There is a need for a reconfigurable display designed according to ergonomic and cognitive principles based on the activity and workflow of a user of the measurement and management system.

BRIEF DESCRIPTION OF THE DRAWINGS

The headings provided herein are for convenience only and do not necessarily affect the scope or meaning of the claimed invention. In the drawings, the same reference numbers and any acronyms identify elements or acts with the same or similar structure or functionality for ease of understanding and convenience. To easily identify the discussion of any particular element or act, the most significant digit or digits in a reference number refer to the Figure number in which that element is first introduced (e.g., element 204 is first introduced and discussed with respect to FIG. 2).

DETAILED DESCRIPTION

Various examples of the invention will now be described. The following description provides specific details for a thorough understanding and enabling description of these examples. The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this Detailed Description section.

In summary, systems and methods for measurement and management are disclosed that provide complex measurements cost-effectively at very high accuracy. These methods and systems in some cases achieve measurement accuracy exceeding the accuracy of the reference standards they rely on, and eliminate expensive and disadvantageous recalibration procedures. The accurate measurements are integrated with management functions, applying the measurement data to meet objectives of the integrated system and workflow goals of its user. The disclosed systems and methods comprise an explicit or expressly represented model both of themselves and of candidate external systems to be measured and managed. The models may be configured and reconfigured by the owner-user through either local or remote means. The system intelligently reconfigures itself to adapt dynamically to the conditions of measurement and the user's and system's goals at each moment. In an embodiment, the system comprises high-accuracy and reconfigurable components including a meter or control head adapted for user precision assembly and maintenance that computes and displays or communicates the measurements, displaying measurements in desired units, grouping functions according to ergonomic and cognitive principles based on the activity and workflow of a user in relation to the internal model. The use of models permits the system to compute and provide complex and inferred measurements of ultimate interest to the user, including quantities that cannot be directed measured and only can be determined through reasoning or computation by applying models to raw measurement data. The precision-assembly modular electromechanical design further permits an owner-user to precisely assemble, maintain, and modify the apparatus and calibrate the equipment for accuracy.

Method and System for Calibrating the Measurement System to Adapt it to the Known Reference Voltage Value We disclose a method and system for achieving high accuracy in a measurement system comprising calibrating the measurement system using a reference device having a reliable known or determined high-accuracy reference value.

Figure 1:
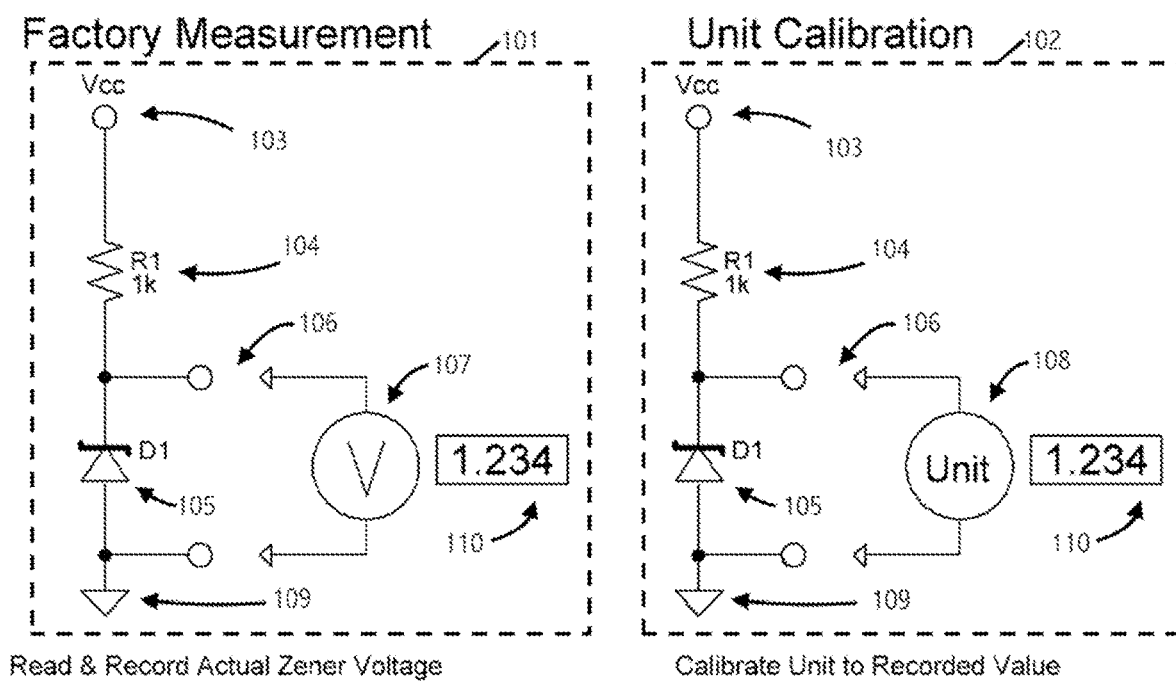
FIG. 1 is a drawing of the system and method of calibrating a measurement system to adapt it to the known reference voltage value. There is a schematic electronic diagram of the voltage reference device pre-calibration, and a diagram of its assembly-time insertion for use in the measurement system's sensor circuit.
Figure 3:
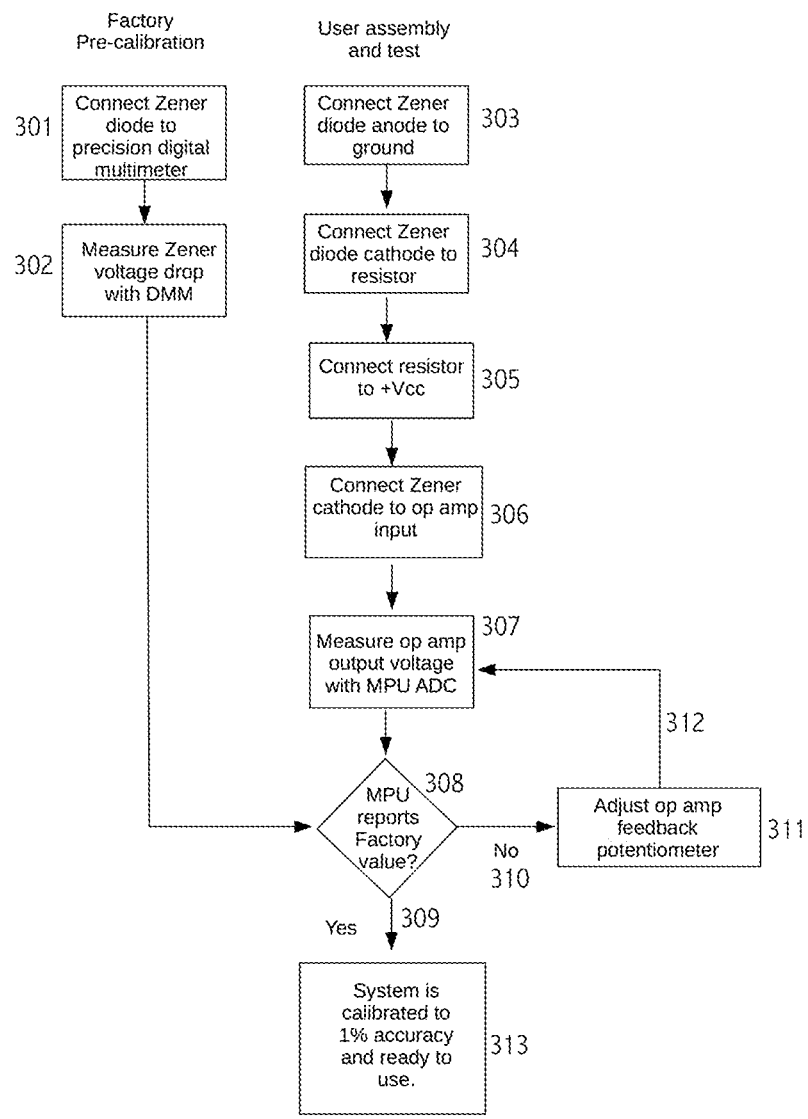
FIG. 3 is a flowchart of the method of calibrating a measurement system to adapt it to the known reference voltage value.

FIG. 1 illustrates an exemplary method and system for calibrating a measurement system to adapt it to a known reference voltage value, comprising a schematic electronic diagram 101 of the voltage reference device pre-calibration, and a diagram 102 of its assembly-time insertion for use in the measurement system's sensor circuit. FIG. 3 correspondingly provides a flowchart of the method of calibrating a measurement system to adapt it to the known reference voltage value.

In a first step, such as before the equipment of a measurement system is assembled, a voltage reference value 110 for a voltage reference device 105 is read and recorded accurately, comprising connecting the voltage reference device according to step 301 and measuring its voltage drop according to step 302. For example, a manufacturer can use a high-accuracy calibrated digital multimeter 107 to measure the reference voltage value of the voltage reference device 105. Relatively inexpensive calibrated digital multimeters are available today that can measure voltage to 1% accuracy or better. Beneficially in this method, only the manufacturer of a measurement and management system needs this high-accuracy measurement apparatus. Later assembly leading to an equally accurate measurement system does not require further use of such high-accuracy equipment, because the voltage reference device has been precisely, accurately measured and now itself serves to provide the voltage standard used to achieve high accuracy for the entire measurement system.

In an embodiment, the voltage reference device 105 is a Zener diode. In an exemplary embodiment, the Zener anode is now connected 303 to ground 109, the Zener cathode is connected 304 through a resistor 104 to +Vcc (e.g. +5 VDC) 305, the input of the measurement system device unit 108 comprises an operational amplifier (op amp) connected 306 to the cathode at location 106, and the op amp output is connected to a voltage-measuring input within the digital meter component of the measurement system. In an embodiment, the voltage-measuring input of the measurement system is the analog-to-digital (ADC) input of a microprocessor unit or microcontroller device (MPU), such as an Atmel AVR, Atmel SAM ARM processor or equivalent MPU having one or more ADC inputs capable of measuring 307 the voltage, that is, of receiving a voltage and providing a digital representation thereof to the MPU for further storage, use, and computation. It is understood that alternatively, multiple circuit components may collectively comprise such a voltage measurement circuit, such as an external ADC integrated circuit attached operably to an MPU. In an embodiment, the measurement system measures the output voltage of the op amp on a corresponding MPU ADC input, the feedback of the op amp is controlled by a trimmer potentiometer, and the trimmer potentiometer is adjusted 311 to increase or reduce the slope of the op amp circuit amplifier gain curve until the MPU senses a voltage on its ADC input equal 309 to the previously-recorded voltage reference value of the voltage reference device, thus accurately calibrating the op amp and corresponding ADC input of meter component. In one embodiment, the voltage reference device is successively attached to the op amp input for each MPU ADC input and that input op amp gain is adjusted and calibrated. The voltage reference device then is removed from that op amp circuit. Once each ADC input and its corresponding op amp input is successively calibrated, the entire measurement system as a whole is calibrated 313.

In an alternative embodiment, the voltage reference device 105 is connected successively to each op amp input temporarily or switchably, such as through a switch device. The switch may be operated either manually or under automatically, such as under the control of the MPU. In one embodiment, a single voltage reference device 105 is switched among the inputs during calibration. In an embodiment, more than one voltage reference device 105 is used. For example, each ADC input may have its own voltage reference device 105 with its own voltage reference value 110, and that input's voltage reference device may be switched into the circuit during calibration 102, and then switched out of the circuit during normal measurement by the measurement system. Beneficially these steps may be performed by the assembler or owner-user of the equipment.

In an alternative embodiment, a digital potentiometer may be used as the trimmer potentiometer. The MPU beneficially may control and record its adjusted value, such as in EEPROM memory. In this embodiment the voltage reference value 110 may be entered numerically or symbolically into the measurement system such as through a front panel display or may be provided as data such as over a network of any kind connected to the measurement system. This embodiment permits the measurement system to calibrate its ADC inputs without human intervention using the voltage reference value 110. Digital potentiometers may be cascaded or combined in the trimmer potentiometer circuit as required by connecting them using series and parallel circuits to achieve higher step resolution than is provided by a single digital potentiometer.

A digital potentiometer offers the benefit of remote or automated calibration or recalibration of the circuit. The resolution of the range of adjustment of the digital potentiometer may be improved beneficially by placing it in a voltage divider network, such that it adjusts the gain of the op amp over a smaller range at correspondingly finer resolution.

Upon completion 313 of this calibration procedure, the measurement system will comprise a highly accurate calibrated voltmeter system. This novel method can consistently and cost-effectively achieve 1% measurement accuracy or better. This is a significant and material improvement over the accuracy of existing measurement apparatus.

In an exemplary embodiment, highly accurate power measurement over a power handling range of 0.05 watts to 2 kilowatts is achieved by virtue of a 12-bit ADC resolution for the voltage received by the meter or control head MPU from the sensor.

In an embodiment, the one or plurality of voltage reference devices 105 may be adapted to be easily removed from the circuit and replaced with a substitute voltage reference device 105 that is currently-certified and for which the owner is provided the voltage reference value or values 110. The owner then may perform a recalibration 102 of the measurement system equipment using the new voltage reference device 105 and corresponding data, again bringing the measurement system 108 into compliance with calibration certification standards. In an embodiment, the calibrated replacement voltage reference device 105 may be mounted on a carrier such as a daughterboard printed circuit board (PCB) or other pluggable module that also comprises an EEPROM chip into which the voltage reference value 110 has been stored. This single module then can be used to achieve calibration recertification. In one embodiment, the recalibration may be achieved manually. In an embodiment, the measurement system may recalibrate itself automatically when the module is inserted. In an embodiment, recalibration may be performed by user input or remote command, such as by pressing a button, selecting a menu item, providing speech input, providing remote commands such as may be issued over any wired or wireless communications network, or attaching a data-bearing module or other device. Notably, these techniques are not limited to the sensor and apply as well to the meter or control head apparatus.

In an embodiment, the EEPROM or other nonvolatile storage available to the MPU also may contain recalibration and other system data, such as the unit model and serial number, the recalibration date, the identity of the individual or entity that performed or certified the calibration, and the calibration expiration date, as well as essential update information for the device, such as tables of correction data, additional algorithms and procedures or "applications," firmware updates, and personal customizations or purchased options and upgrades specific to this customer, serial number, model, or configuration. These data may be beneficially made available to the user through any output means such as display or audio, may be available to the one or plurality of MPUs in the measurement system, and may be made available to connected devices and systems such as through any communications network. In an embodiment these data are used to reason about features, capabilities, performance of equipment and to communicate those details to other systems and equipment. In an embodiment, the measurement system contains executable firmware or software that affords an ability to transmit and receive data to and from remote devices such as over any communications network or means of attachment, and can respond to inquiries for its internal data and issue alerting communications to other devices or systems, such as to warn of an impending certification expiration or respond with the measurement system's firmware revision version, upgrade status, capabilities, and other internal data. The use of EEPROM as nonvolatile storage is exemplary but not limiting, and these data also may be provided by attached or networked apparatus whether local or remote. Such attached or networked sources may be used to download and install additional applications into the system storage that update or augment the system's capabilities.

Automated Adaptation of the Measurement System for Drift, Error and Nonlinearity We disclose a practical, beneficial alternative to existing designs comprising providing the non-sensor components of the measurement system with data and electronics to adapt the measurement system to variation and drift in either or both the sensors and the display (meter) component. In our method and corresponding system, sensor error is either measured by the owner-user or characterized in an algorithm, formula, or table form, and then is provided to a computation and/or display (for example, meter or control head) component of the measurement system. In this embodiment, the sensor error may be characterized by a multidimensional and changing set of criteria, and the sensor correction factor data beneficially may be updated at the meter rather than at the sensor.

It will be understood that the disclosed computation and/or display functions of the meter or control head component are exemplary and not limiting, and for the purposes of this disclosure they may be interchangeable. Commonly, electronic equipment has a human interface that at least optionally permits humans to interact with the equipment and systems it measures and manages, but it is understood that there also are embedded systems that operate without close human supervision or instruction. In one embodiment, no visual display is employed at the meter or control head component, which sends its measurements and receives management data over a communications medium such as a network, ultimately connected either to human users having a human-compatible interface or to other embedded or computing systems not necessarily having a human present.

Figure 2:
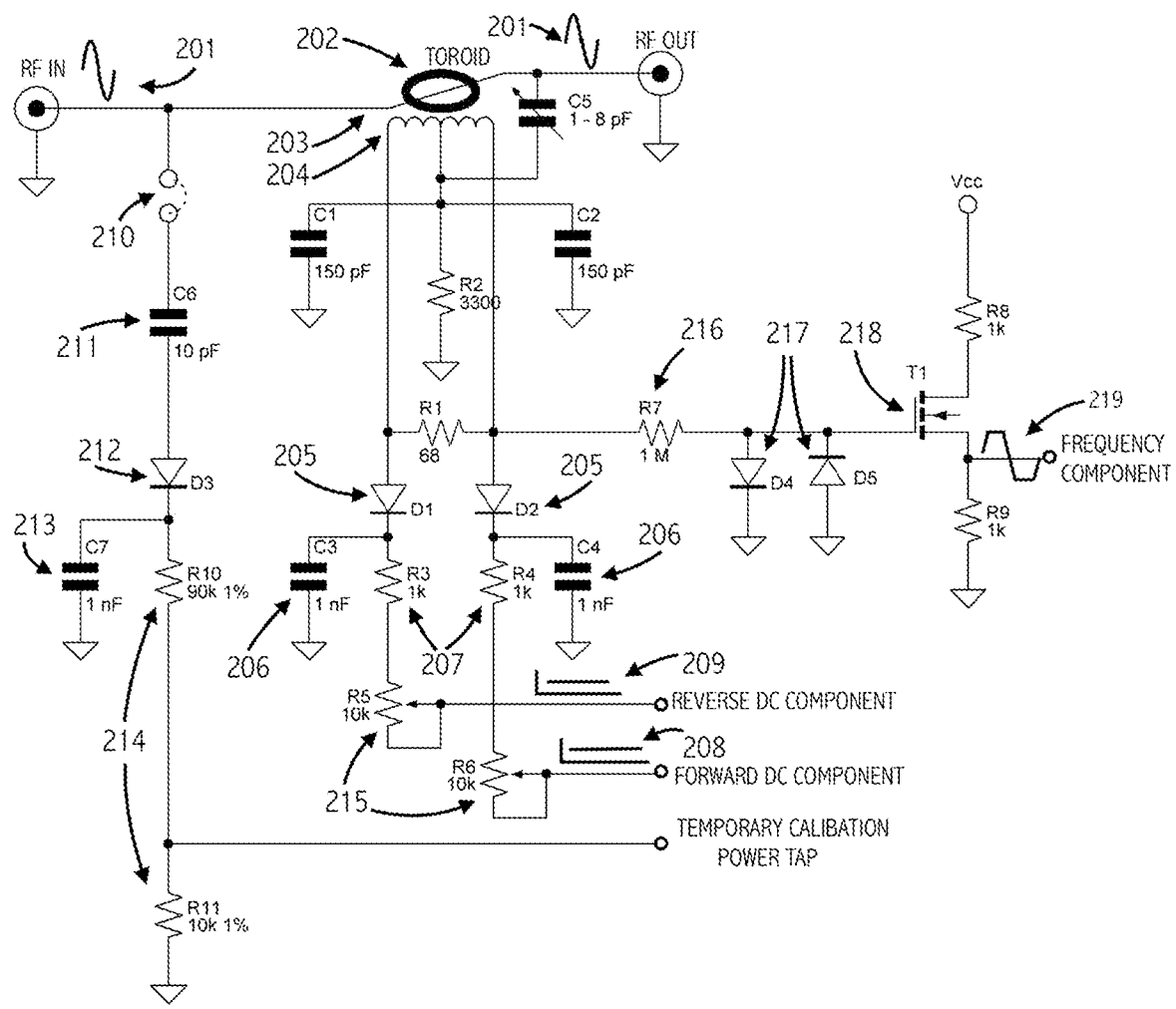
FIG. 2 is a drawing of an exemplary embodiment of integrated power and frequency sensor circuitry, before frequency prescaling.

FIG. 2 illustrates exemplary integrated power and frequency sensor circuitry, before frequency prescaling. In one embodiment, the user-owner assembles or adapts the measurement and management equipment, and at the time of equipment assembly or adaptation beneficially calibrates the sensor for high or improved accuracy using the already-calibrated meter device. In an embodiment, the sensor comprises a contactless inductive RF power measuring apparatus. This embodiment may be achieved using a signal-carrying conductor 203 that penetrates, without contact, the center of a toroidal inductor 202 around which sensing wires 204 are wrapped. This beneficially provides for sampling a tiny amount of the power of the signal 201 passing nearby in the conductor, and inducing a corresponding voltage in the sensing wires. The sensed voltage then may be rectified and filtered, such as by rectifiers 205, capacitors 206, and resistors 207, and transmitted to the meter component, as distinct forward 208 and reverse 209 rectified components in one aspect. In one embodiment the rectified filtered voltage is transmitted directly to the meter. In an alternative embodiment, the rectified filtered voltage is amplified by an amplifier, such as a differential amplifier, contained within or attached to or associated with the sensor, allowing the voltage signal to be transmitted from the sensor over a long distance and through an electromagnetically harsh environment such as in the radiating field of an antenna without suffering significant induced common-mode interference.

Transmission of the voltage between the sensor component and the meter or control head component may be either wired or wireless. To transmit the voltage information wirelessly, the voltage may be encoded into data form at a wireless transmitter located at the sensor, and reconstructed into a precisely corresponding or linearly or nonlinearly scaled voltage at a corresponding receiver, whence the voltage may be delivered to a meter or control head component for accurate measurement. Wireless transmission may be implemented using one or more standard protocols such as WiFi, Bluetooth, PSK31, or wireless RS481 or a custom protocol. In one embodiment, a wired transmission cable component comprising one or a plurality of wires carries the voltage signal between sensor and meter or control head. In an embodiment, the cable has one or a plurality of plugs that mate with a corresponding jack at the sensor and/or meter or control head. In an embodiment, the cable is shielded. In one embodiment, the jacks are of the "Keystone" modular type and may comprise RJ45, USB, or other standard jack and plug components. In an embodiment, the jacks are keyed or unkeyed header-style pin jacks. In one embodiment, shielded Ethernet cable such as Category 6 ("Cat6") or Category 7 ("Cat7") cable is used to transmit the voltage between sensor and meter or control head. In an embodiment, RF-shielded cable such as coaxial cable ("coax") or twinaxial cable ("twinax") or other RF-shielded multiconductor cable or cables are used to transmit the signal between sensor and meter or control head. In an embodiment, the shield conductor of the shielded cable terminates at one or both of its ends to a conductive surface tied to a ground point such as RF or chassis ground to enhance resilience against RF interference (RFI) caused by stray or intentional radio-frequency fields in which the sensor is positioned or through which the cable must transit during operation. In an embodiment, the cable may be extended through the use of a shielded inline coupler that preserves its RFI immunity and permits the ground connection of one or both ends of the cable to be electrically preserved for the length of the cable. In an embodiment, the cable may be extended through the use of an inline coupler that does not permit continuous electrical connection of the shield, breaking up induced RF on the shield to prevent it from reaching the endpoint of the cable. In an embodiment the non-conductive inline couplers are positioned to create non-continuous lengths of cable the length of which are mathematically chosen so as to minimize the opportunity for the shield to receive ambient RF energy and carry it as common-mode current, such as by positioning the couplers to prevent any length of shield from being resonant at the known or anticipated frequency or frequencies of the ambient RF field. This arrangement may be beneficially combined with a common-mode filter such as a choke balun or snap-on toroidal chokes positioned on the outside of the cable to limit or eliminate stray common-mode current on the cable and improve the noise immunity and front-end overload resilience of the system.

In an embodiment, to calibrate the sensor, the user-owner temporarily directly attaches, at a jumper, header, terminal strip, socket, or other attachment point 210 within the sensor, an additional power-sensing calibration circuit to the sensor's conductor. In an embodiment the additional calibration circuit employs high-accuracy components such as resistors having a rating of 1% tolerance or better in order to achieve high calibration accuracy. In one exemplary embodiment, a small-value capacitor 211 connected to the conductor 203 passes radio-frequency current to a diode 212, which in turn is connected to a small-value filter capacitor 213 to ground and also to a voltage divider comprising 1% resistors 214. This circuit can be characterized mathematically or empirically in advance to determine that a specified number of watts of radio frequency results in a known output voltage from the voltage divider 214 at a nominal 1% measurement accuracy. The user-own uses this apparatus and the previously calibrated meter of the measurement system to measure and record the output voltage produced when an unknown power level is provided to the conductor. The user-owner then disconnects the temporary sensing circuit and repeats the measurement using the normal sensing wires and the meter, and adjusts a calibration potentiometer 215 within the sensor apparatus to match the just-recorded output voltage. This method and apparatus calibrates the sensor to a nominal 1% accuracy under the specified test conditions.

In an alternative embodiment, the user may provide a known power level and frequency and use external measurement equipment of known high accuracy to calibrate the meter apparatus for known conditions.

In an embodiment, to adapt the measurement system to other operating conditions, such as different presented frequency and power levels, a characterization comprising a statistical sample or mathematical analysis of the sensor response curves or behavior is performed, such as in advance by the manufacturer or designer of the sensor. This characterization comprises a quantitative model of the sensor or population of sensors and then is provided to and incorporated into the model representations and data of the meter or control head apparatus. The meter or control head thus comprises data characterizing each attached or attachable sensor and may use those data to perform an automated instantaneous adjust of its own measurements by indexing into the model using the model criteria. Exemplary model indexing criteria comprise frequency and power level.

To provide frequency data, for example as meter or control head model indexing criteria, one or more attached sensors may provide an integrated or separate frequency signal. The frequency signal may obtained directly or indirectly as an electronic or electromagnetic sample of the sensed RF signal, or may be a scaled version of the sensed signal. Scaling may be achieved through supersampling or subsampling by frequency, or by scaling of electrical properties such as voltage, or any combination thereof. In an exemplary embodiment, a sensor as described herein for power and SWR sensing further comprises a frequency sampling circuit attached to the toroid sensing wires in parallel with the power-sensing circuit. In an embodiment, the frequency sensing circuit comprises a resistor 216 and two diodes 217 providing front-end overvoltage protection, one with its anode attached to the resistor and cathode to circuit ground and one with its cathode attached to the resistor and anode to circuit ground, and the junction of the diodes and resistor is further connected to the gate of a field-effect transistor (FET) 218 having sufficient frequency response for the frequency to be sensed. In one embodiment, the circuit then provides a frequency component signal 219 at the source or drain of the FET, one of which is connected to the input of a line driver integrated circuit to produce nominal 0-5 VDC logic-level transistor-transistor logic (TTL) outputs which are fed to a Schmitt trigger to convert them into a square wave. In an embodiment this circuit further comprises a divide-by-N circuit that reduces the frequency by a known scaling factor such as by 100 for high-frequency (HF) and very high frequency (VHF) signals or by 1000 for VHF and ultra-high frequency (UHF) signals. The divide-by-N circuit reduces the frequency sample, which then is supplied as a signal by wired or wireless means to the meter or control head circuitry, where lower-frequency frequency counter electronics determines the sampled frequency and multiplies by the scaling factor, thereby permitting the MPU to compute and identify the original signal frequency. This beneficially permits a lower-cost lower-speed MPU to perform the frequency counter function while still preserving an acceptable number of significant digits of accuracy (+/−1 digit in the least-significant digit place), such as nominal 6 significant digits. It also sends a reduced-frequency signal from the sensor to the meter or control head, improving noise immunity and unintentional signal radiation and RFI generation of the measurement system. For example, with a transmitted and sensed signal 201 at 54.0 MHz, a scaling factor of 100 provides for 100 Hz frequency resolution with an accuracy of +/−100 Hz. This frequency resolution and accuracy are more than suitable both for indexing into the model characterizing the sensor and for use as data, for example for direct display to a human user for use in communications system management, for remote reporting to another system, or for further local computation. Relevantly, the frequency resolution this method and system achieves is at least as fine as the nominal signal bandwidth of most modes of medium to high bandwidth, symbol rate or information rate common in modern communications systems. In an embodiment, frequency scaling is performed using a scaling factor that is a power of two, such as 128 or 1024, which permits highly efficient bit-shifting operations to be used instead of more computationally expensive division or multiplication operations in the MPU for reconstruction of the original sampled frequency. In an alternative embodiment, a faster MPU is used and a correspondingly lower scaling factor is employed, providing for even finer frequency resolution such as for identifying the center or carrier frequency of very slow symbol rate or very narrow bandwidth communications with high accuracy and precision.

Incorporating the frequency measurement circuit into at least one sensor also beneficially permits the meter or control head to compute with and report frequency directly. For example, the meter now may display transmitted frequency of the sensed transmission system, and thus serves either as a frequency counter or as a digital frequency display for the transmitter or exciter, such as to provide for frequency display component of a variable frequency oscillator (VFO) or to display the one or plurality of fixed frequencies in a channelized or crystal-controlled transmitter or exciter.

In one embodiment, the firmware of the MPU further is adapted with a frequency band model comprising a table containing the published regulatory specifications defining the correspondence between individual frequencies and bands legally established for operations according to defined regulatory services or communications modes of operation, and the measurement and management system then is configurable to display the band as well as the frequency of transmission and to use the band-related model data to perform management actions such as selection of an antenna appropriate that maximizes a scalar or multidimensional objective function such as achieving minimum SWR, maximizing ERP, or maximizing ERP up to a regulatory limit or combinations thereof.

Especially in a digital electronics measurement and management that comprises one or more MPUs, another source of inaccuracy can result from various forms of clock circuit drift. Clock circuits in this context are electronic circuits that provide timing information essential to the operation of the MPU and the apparatus it measures and controls. They may also be further used as a synchronization, elapsed time or time-of-day data source to other circuits, to software, or to human users. High-accuracy clock circuits may be used for their own timekeeping purpose but also are ubiquitous in electronic circuits and are necessary to implement certain modern communications entailing timed, coherent or synchronized communications.

We disclose methods and systems for adaptive recalibration of clock circuits to improve their accuracy. In an embodiment, the owner-user performs empirical tests to collect external data that are used to reliably enhance equipment measurement accuracy. In this embodiment the user performs timing tests to collect clock error data and provides the clock error data to the measurement system, which is adapted to use the error data for self-correction and enhanced accuracy. In an alternative embodiment, a reliable reference time source is connected to the measurement system and provides the data needed to adjust the clock circuit for improved accuracy. In this embodiment fully-automated external reliable timing data are provided or collected and used to greatly enhancing equipment measurement accuracy. Exemplary external sources include GPS data source, Internet NTP server, cellular telecommunications, and broadcast precision time data.

In a first embodiment, for clock circuits deriving their timing source from an alternating current (AC) source, the measurement system MPU is ultimately connected to a reliable signal source that does not necessarily provide a time signal but has a highly reliable unvarying property such as AC voltage frequency. One exemplary reliable frequency source is an external stable electric power utility AC mains line, the voltage peaks of which can be counted to keep time. Clock circuit drift is possible despite the reliability of an external AC signal synchronization source due to factors including very small inherent unresolvable accumulated error in an AC voltage-based counting algorithm, small intentional or unintentional changes in the frequency provided by the external synchronization source (e.g. an electric utility may alter its line frequency throughout the day by a fraction of a percent), or the presence of line noise comprising the imposition of additional unwanted waveforms on the synchronization signal. Line noise today is a particularly insidious and pervasive problem due to the increasing modern use of electrically "noisy" appliances, switching-mode power supplies, and common-mode RF interference emanating from such appliances, as well as noise spikes transmitted from them back into and through building electrical wiring. Under certain special mathematical conditions entailing waveform cancellation, to the extent the waveforms of such noise sources are effectively random, they may change the clock circuit time back and forth in a manner that self-cancels, producing little or no clock drift and correspondingly requiring little or no correction. However to the extent the interfering source waveforms are non-random and additive to the frequency source waveform, they systematically shift the clock circuit time in one or another time direction, retarding or advancing its time count, typically at a small and slow rate.

We disclose the method and system of empirically determining systematic time shifts and then using the measured shift to adapt the clock circuit to the unwanted signal. In one embodiment, the measurement and management system owner-user initially sets the clock circuit to be precise, accurate and correct using a reference source known to be of high quality, such as a GPS or US Naval Observatory time provided directly or indirectly via Internet such as by the NTP protocol, a cellular phone system signal, or by radio transmission such as the NIST WWV or WWVH or Canadian CHU radio stations. The owner-user then lets the clock circuit run without interruption for a defined period of time, such as one day. At the end of this test period the owner-user measures the clock circuit drift against the known-good reference to establish an "error signal," that is, the quantitative degree of drift. The owner-user then engages an AC Adaptive Recalibration mode of the measurement and management system and the enters the error signal (i.e., drift quantity) using the system's display interface or a networked data interface. The measurement and management system comprises a model and corresponding predefined data storage where the drift quantity is stored for self-reconfiguration and adaptation by the system. Subsequently, in the course of its normal timekeeping and other MPU operations, the measurement and management system runs an internal timer or firmware counter and periodically adds or subtracts time to the clock circuit time to adjust itself back to the correct time according to the stored drift quantity. In this way extremely high accuracy can be achieved even in the presence of synchronization source variations, physical and computational limitations on timekeeping algorithms, incidental RFI or electromagnetic interference, environmental variations, and line noise.

In an embodiment, the drift quantity is converted by the MPU upon owner-user entry to comprise two values, a coarse adjustment and a fine adjustment. The coarse adjustment comprises the number of seconds to add periodically to correct for major drift variation. Routinely this may be stored as a small integer number. For example, if the correction period is hourly, then an eight-bit number suffices to store a coarse adjustment quantity in the range [−127,127] corresponding to a continuously achieved automated accuracy self-recalibration able to adapt to up to approximately two minutes per hour, nearly 4%, of external synchronization signal drift. This method is applied when the AC synchronization signal is available to the clock circuit, such as when the measurement and management system is operating on an AC power source. It will be understood that the period and adjustment quantity size are exemplary and may be selected to achieve any desired range of accuracy recalibration in response to actual degree of empirical drift.

The fine adjustment comprises the length of time, e.g. the number seconds, to elapse before the system makes a +/−1 sec fine correction to correct for residual variation. In one embodiment, this may be implemented in the MPU firmware using a countdown timer. In an embodiment, the coarse and fine timers are set to employ a period and perform the adaptation at an instant that will not disrupt and introduce error into the correct timekeeping or display of the clock. In an embodiment such disruption and error is avoided by taking into account any modular arithmetic computation in which the clock circuit is about to engage and scheduling error correction changes to occur other than at or near the mathematical cusp where such modular arithmetic causes rollover, for example from 12 o'clock to 1'oclock.

The fine adjustment further tunes the accuracy of the clock circuit and beneficially achieves very high accuracy greatly exceeding the accuracy of the synchronization source. For example, representing seconds in the clock using a single 16-bit integer plus a separate sign bit or flag permits a single one-second adjustment as infrequently as up to approximately once every 18 hours. This results in a clock circuit accuracy of approximately 16 parts per million when using a synchronization signal that itself only provides for an accuracy that is approximately 35,000 parts per million. Thus by using this method and system, in this exemplary embodiment the measurement and management system's achieved accuracy can be more than two thousand times better than the accuracy of continuous AC signal its clock circuit has available as a reference synchronization time source.

In a second embodiment, improved accuracy of the clock circuit is achieved via DC adaptation of the MPU to an internal clock source such as its MPU oscillator. This method and system beneficially adapts the clock circuit to adjust for variations in the internal electronics of the measurement and management system, such as may occur during integrated circuit or crystal manufacturing. Although some integrated circuit manufacturers, such as Atmel, provide a means of adjusting an internal MPU "oscillator calibration" value to tune and adapt the MPU's internal oscillator to chip manufacturing variations, the adjustment has limited range and resolution and the adjustment curve is significantly nonlinear and nonmonotonic, resulting in very limited ability to adapt to normal manufacturing variations and a correspondingly poor achievable clock circuit accuracy. The disclosed method and system and its embodiment also beneficially adapts the clock circuit for improved accuracy when operating in the absence of the AC electric utility line frequency or other continuously available external synchronization signal, such as when operating in direct current (DC) mode on battery power during a power failure or disconnected-state operation such as when portable or mobile.

In this embodiment, the owner-user again initially sets the measurement and management system clock circuit using a reliable known high-quality standard and then measures clock drift over a defined period of time, as for the AC adaptation, but while powering the system from a known-stable DC power source such as fresh batteries. In an embodiment, as with the AC adaptive recalibration, a DC adaptive recalibration drift quantity is converted by the MPU upon owner-user entry to comprise two values, a coarse adjustment and a fine adjustment. The a coarse adjustment and a fine adjustment values are used as an error signal in the same way the AC adjustment values are used, but when the clock circuit is operating on a DC power source. Specifically, the owner-user engages a DC Adaptive Recalibration mode of the measurement and management system and the enters the error signal (i.e., drift quantity) using the system's display interface or a networked data interface. The measurement and management system comprises a model and corresponding predefined data storage where the drift quantity is stored for self-reconfiguration and adaptation by the system. Subsequently, in the course of its normal timekeeping and other MPU operations, the measurement and management system runs an internal timer or firmware counter and periodically adds or subtracts time to the clock circuit time to adjust itself back to the correct time according to the stored drift quantity. In this way extremely high accuracy can be achieved even in the presence of manufacturing variations, physical and computational limitations on timekeeping algorithms, incidental RFI or electromagnetic interference, and environmental variations.

In an embodiment the clock circuit periodically self-regulates by initiating the recalibration without human intervention or initiation. Self-regulation can occur whenever the measurement and management system has access to a trustworthy external reliable time source against which it can run its timing test to collect the drift values. For example, the clock circuit can recalibrate itself when such sources become available. Notably, the system does not merely reset and correct its time using an external standard, but measures the degree of drift under situations of both availability and non-availability of an AC reference signal, determines the coarse and fine drift components, and uses them to eliminate the effects of sources of residual drift, thus continuing to be highly accurate and correct against induced or inherent drift when no reference source is available.

It will be appreciated that each clock circuit and each MPU in the measurement and management system may comprise its own separate model, drift time, adjustment parameters, and embodiment of an accuracy enhancing method and system. Thus, for example, one super-accurate clock circuit may be maintained and the other clock circuits and/or MPUs may use it as an accurate internal reference to achieve equally high accuracy. The highly accurate clock also may communicate a signal or timing data externally from the measurement and management system to other devices such as via a data network such as a wired or wireless LAN or the Internet and using TCP/IP protocols including such time distribution protocols as NTP, and may beneficially be connected to physical timekeeping devices, wall clocks, electromechanical equipment, test equipment, Internet of Things devices, manufacturing equipment, security systems, computing equipment, radio equipment, and other apparatus to provide attached, networked or external devices with accurate timing information, thus serving as a high-accuracy distributed time source.

Model-Based Computation and Control of Measurement and Management Systems

In an embodiment, mathematical, computational, and artificial intelligence models are beneficially expressly incorporated into a measurement and management system to permit the equipment to perform reasoning about its own measurements and methods. In one embodiment, models are incorporated using a computable knowledge representation such as one or more of frames, cases, databases, forward- and backward-chaining rulesets, property lists, association lists, theorem prover representations, taxonomic tree structures, digraphs, and symbolic form, as well as in mathematical model and computable data structure forms.

In one embodiment, representation of models is explicit, declarative, and symbolic.

In one embodiment, mathematical models may be represented using linear equations expressed in a computable form, such as by using data structures such as vector data objects, multidimensional array objects, or other computable composite data structures to represent equation coefficients. In an embodiment, a mathematical model may be represented using systems of nonlinear simultaneous differential equations, where components of a system are represented by variables and behavior is represented by the coefficients of those variables, and the system of equations is implemented in composite data structures. In one embodiment the system of equations then may be solved using a theorem prover or equation solver computer program. In an embodiment the solution to the system of equations may be computed using approximation or refinement techniques such as numerical integration or linear regression. In an embodiment, the mathematical equations may represent a linear or nonlinear function using a heterogeneous system of one or a plurality of individual equations, such as a line equation or mathematical spline representation of a complex curve, which then is implemented in software or firmware using composite data structures. In an embodiment statistical regression or curve-fitting techniques are used to develop and represent the model data. Explicit representation of such mathematical models beneficially permits computations not commonly available in existing equipment and systems such as question-answering, interpolation with high accuracy, behavior forecasting, error analysis, failure prediction, limit determination for a method or system, cost function computation, augmentation over time of the express model knowledge within the system both intrinsically and extrinsically, and transmitting, receiving and reporting status and component or system capabilities to attached, remote, and/or networked systems and devices. In an embodiment, intrinsic augmentation of the model knowledge and data may be achieved by incorporating learning means within the measurement system including both symbolic reason-based learning and numerical or reinforcement learning techniques, and extrinsic augmentation comprises delivery to the measurement system of knowledge and data for incorporation into its models from an attached device or over a communications medium such as a wired or wireless data network.

In one embodiment, express model knowledge is further compiled for efficient storage and use, such as in a C structure ("struct") or an object-based programming method comprising selector "methods" and corresponding procedures associated with a composite computational object. In one aspect, when a compiled representation is used, it is provided using the same or equivalent ordering, manifest datatypes, namespace, and other computational features of the express declarative representation. In an embodiment both the uncompiled declarative representation and the compiled representation of the model data are provided within the single system. This facilitates data transfer among and reasoning across different devices and systems using alternative manifest representations of the underlying model. Model data beneficially may include procedural knowledge, such as rule-based methods and computable effective procedures, as well as passive data. This permits devices and systems to communicate and share their methods and their knowledge about device and system features, capabilities and limitations and measurement and management methods and apparatus, notably when they are networked or otherwise connected together.

In one embodiment, the model comprises annotations operable to provide explanations or augmented causal reasoning. This can be achieved by specifying places in the model where additional or supplemental explanatory data can be attached to the model. For example, additional slots in a frame model or additional metarule or metalevel facts in a rule-based model comprising annotations to the base-level knowledge may be used to associate these additional or supplemental data with base-level knowledge, or with groupings or subgroupings of the base-level knowledge comprising abstractions of the domain knowledge. The annotation data may comprise additional explanatory data. Exemplary annotation data include metadata recording why a rule or fact is effective, how a fact was inferred using forward or backward chaining, and the conditions under which a rule are or may be applied. The system's own reasoning mechanisms as implemented in its software and executing on its own MPU or MPUs then may beneficially query and apply the annotation data to provide explanations for findings of an inference algorithm, the reason one heuristic was applied instead of another, or the basis for a change of reasoning leading to a measurement or other result. The annotation data may be at the same level of abstraction as the data they annotate, or they may be more abstract in order to provide more compact and informative explanations to humans than are provided by a simple enumeration of detailed steps taken to achieve a result. They may be in the native representation employed by the system to admit further reasoning, such as in declarative predicates or propositions or frame/slot or name-value pairs, or they may be in non-computable but explanatory form such as natural language phrases or expressions or audiovisual data such as may be understood by owner-users of the system. In one embodiment the annotations are developed prior to the purchase and first use of the system by its owner-user. In an embodiment the annotations are developed dynamically during the use of the system by its own internal mechanisms. In an embodiment, initial annotations are developed and provided with the system, and further annotations are developed after its first use and recorded in its internal database of model data, such as its frames, rule and fact sets, formulas and other mathematical model data, and computed model representation, thereby augmenting and improving its explanatory data and capabilities. In one embodiment initial annotation data are provided in a read-only implementation, and a cached version of the initial read-only data may be further manipulated, updated, and changed, but in the event of a system reset the initial read-only data may be restored at the discretion of the owner-user either with or without preservation of the dynamically developed annotation data.

It will be understood that these annotation, explanation, modeling, and reasoning methods are not limited in their application to electronics-based measurement systems, which are exemplary as to this invention and disclosure. For example, decision support systems, robotic systems, user interaction systems, appliances, explanatory systems, educational and teaching systems, user assistance systems, navigation systems, entertainment systems, weapons systems, intelligence analysis systems, public safety systems, health and medical systems, aeronautical and transportation systems, manufacturing systems, financial and accounting systems, electronic and software design systems, diagnostic systems, communications systems, agricultural systems, information management systems, scientific apparatus systems, space exploration and development systems, recreational systems, construction management systems, and licensing and legal information management systems all are intended by this disclosure and will benefit from these inventions.

In an embodiment, the representation of the model is transmissible to other systems and apparatus. In one exemplary embodiment, transmissible model content is provided by encoding the content of a declarative rule and fact database into a beneficially compact standard form. Prior to transmission the content may be expressed using syntactic forms such as a list processing derived format, JSON, or XML. Physical (PHY) level transmission may be either wired or wireless. Link-level transmission may be packetized or in a stream or virtual circuit form. In one embodiment, conventional networking and data communications methods such as TCP/IP protocols, X.25 and its variants, or bus signaling and encoding methods such as USB and PCI provide a means of interface to standard external equipment, both directly attached and remote such as over a telecommunications or data network such as the PSTN, a LAN or WAN, or the Internet. The transmissible model then may be used in whole or in part by other equipment. For example, when one measurement system is adapted with or learns additional methods or annotation explanations, its capabilities can be shared with or even "cloned" to other equipment. The use of the disclosed express transmissible models beneficially permits use of model data across a very wide range of equipment, incorporation of conditional knowledge such as a specification of the conditions under which the base-level knowledge of the model is applicable or beneficial, rapid development of a consistent uniform base of knowledge across measurement and management systems, development of knowledge in extreme or unusual field situations that subsequently may be shared by equipment not subject to those unusual conditions, and increased breadth of coverage based on pooling of usage experience among the measurement systems.

In one exemplary embodiment, the model of an electromagnetic information transmission system that is based on or employing a radio transceiver is expressly provided in the measurement and management system. The MPU of the measurement system display (meter) component is programmed to "know," that is to contain express model data structures as to, the structure and relationship of the various components of the system under test, such as that a radio transmission system comprises transmitter or "exciter," a power amplifier, an antenna "tuner" and/or "balun" or other impedance matching transformer, an optional "dummy load" device for receiving and dissipating the transmitter's energy during test periods, one or more transmission lines, and one or more antennas. This human knowledge of the real-world system under measurement is embodied expressly in the software and/or firmware of the MPU.

The owner-user may augment the base model knowledge of the measurement system by entering specifics of the owner-user's system under test or management. For example, the owner-user may enter data indicating the presence of a transmission comprising a 100 watt high-frequency (HF) transmitter or transceiver having a 50 Ohm nominal output impedance, a first sensor comprising both power/SWR and frequency measurement capability connected to the output of the transmitter, an antenna tuner capable of matching up to a 13:1 SWR, an unbalanced coaxial feedline having a loss profile of 1 dB per hundred feet at one frequency and 3 dB per hundred feet at a second frequency, a second power/SWR-only sensor at the end of the feedline attached to a 1:1 balun at the feedpoint of the antenna, and a half-wavelength dipole antenna having a specified center frequency positioned one half-wavelength above earth ground and oriented along a true north-south line. In one exemplary embodiment, the model data and software or firmware in the MPU and its associated memory will additionally comprise domain knowledge such as that a half-wavelength antenna has an impedance of approximately 72 Ohms at its resonant frequency, that according to a link equation method governing the power gain or power losses in the system the individual gains or losses are to be multiplied if in Watts or added if in deciBels (dB), that the efficiency of any system comprises the ratio of output to input, that the two sensors in one system admit computation of the power efficiency between them using the definition of efficiency as a ratio, that a half-wave dipole antenna has a nominal gain of 1 dBd, that there is a defined ratio relating dBd and dBi, that Effective Radiated Power (ERP) is directional and may be represented either in dBi or dBd units, that the antenna pattern for this and each antenna type has a specific three-dimensional directional pattern and numerical gain profile that may be further modeled using antenna modeling software that may be in the MPU or remotely accessible to it, that isotropic ERP is independent of direction, that there is a defined relationship between SWR and measured forward and reflected power, that there is a defined relationship between SWR and Return Loss, that there is a specified relationship between Average Power, RMS Power, Peak Power, Peak-to-Peak Power, and Peak Envelope Power, that the first sensor is of a type that measures frequency but the second is not, that the frequency of the signal does not change en route from the first sensor to the antenna, that power may be represented meaningfully in Watts or dBm, and that power gain may be represented as a power ratio or in dB.

In one embodiment, a method of computing measurements comprises using model knowledge, the data provided by the owner-user, voltage and frequency measurement data from the sensors, and the link equation to compute and report the forward power, reflected power, SWR, and return loss at each sensor, the efficiency of the system segment between the two sensors, the efficiency of the entire system, any of the peak, peak-to-peak, average, or RMS power at each sensor, and the ERP of the entire transmission system as viewed beyond the antenna in the electromagnetic near and far fields. In one embodiment, the sensor provides at least one time-varying voltage that is instantaneously converted to digital format at a defined rate such as 20,000 samples per second by the MPU upon being supplied to an ADC input of the MPU. In an exemplary embodiment, the forward and reflected power each are represented as a time-varying voltage over a defined range, such as 0 to 25 volts. The instantaneous peak power is computable via table lookup using the instantaneous sensor voltage and scaled frequency as table indices into a lookup table comprising a model of the voltage, frequency, and power relation. The RMS and peak-to-peak power are each computable in turn as a scalar multiple of the instantaneous peak power. The average power is computable by integrating the peak power over a defined number of input voltage samples. The peak envelope power is computable by integrating samples for a defined subperiod of a cycle, then length in samples of which is computable from the numeric representation of the frequency signal from the sensor after it has been counted by the meter or control head frequency counter circuit. In an embodiment, the frequency data from the sensor are subsampled and saved for display as a graphic waveform on a display on the meter or sent to a remote networked system, thereby providing for display of the sampled waveform. In an embodiment, the power measurements are represented in dB and the computations are performed through addition rather than multiplication, permitting a cost-effective MPU to be employed that lacks more complex mathematical operators in its native instruction set that cost more to implement in an MPU.

In another method and embodiment, measures of interest such as efficiency of a transmission system component are determined by deploying multiple sensors located before and after the component to be characterized and selecting efficiency reporting at the meter or control head. In an alternative embodiment, only one sensor is used and the efficiency is computed or estimated using a model to substitute for a second sensor, which data further may comprise prior measurements, estimates, or model data stored in or available to the MPU or combinations thereof. In an embodiment, missing components of the transmission system are identified to the system by the owner-user as not present and are properly modeled in the measurement system as to their gain or loss contribution.

In an embodiment, the owner-user alters the structure or arrangement of the transmission system under measurement and management, corresponding change data are entered into or sensed by the measurement and management system to adapt it to those altered real-world alterations, and the measurement and management system correspondingly produces accurate and correct measurements and actions using the updated data.

In an embodiment, estimated or nominal values for characteristics such as component efficiency and gain or loss are substituted by the measurement and management system when the actual or accurate values or not known by the owner-user.

In an embodiment, the system comprises additional computer and/or user-interaction apparatus, and according to a corresponding method the owner-user enters transmission system descriptive data into the additional apparatus, such as a personal computer or via any computing or communications apparatus into a website, and receives parameters to enter into the measurement and management system that characterize the transmission system and are computable or otherwise may be reasoned over using the model data and methods in and available to the MPU. In one such embodiment, a website, mobile device, personal computer, or networked server is configured to accept taxonomic or physical data describing an antenna and returns to the user one or a plurality of parameters to be incorporated into the model of the measurement and management system. In an exemplary embodiment, the user enters into a web form or mobile application structural information about an antenna such as its physical dimensions, construction materials, height above ground, soil or other surface type below, and taxonomic or design class such as half-wave dipole or full-wave loop antenna, and a corresponding set of model parameters is returned to the user who enters them to populate the model data associated with a specified sensor attached to the meter or control head of the measurement and management system.

The measurement and management system then may use these data to perform management functions such as to select from among alternative antennas, compute ERP for a particular transmitted signal, orient or reorient a directional antenna such as by sending remote control signals to its rotator motor apparatus, enable or disable use of amplifier equipment, send signals to remotely retune an antenna tuner, enable and disable options and tune or reconfigure the transmitter or exciter and corresponding receiver equipment, display appropriate corresponding status information to the user on a meter display or transmit it remotely over a data network to other computers or systems, and communicate system or user status or intent information with remote equipment or users.

In an exemplary embodiment, an MPU associated with an antenna tuner measurement and management system infers and stores tuning data according to an internal model comprising knowledge of the connected antennas and their properties, regulatory band data and other frequency-related data, and measurement data. Exemplary band model data comprise band data, band limits to define band edges of tuning and permissible power levels. In an embodiment, in a first step, passive-first autotuning is performed, such as tuning under MPU control with no person required to be present or in control. An attached receiver circuit sufficient to measure either signal or noise and associate it with frequency provides a signal indication to the MPU, and the MPU tunes the antenna tuner for maximum received signal-plus-noise-to-noise ratio on each of a collection or range of specified frequencies, without transmitting a signal according to one aspect. In one embodiment, the entire range of possible tunable frequencies is expressly received, swept, and optimized and results stored. In an alternative embodiment wherein an optimal algorithm or heuristic is employed to map out the capabilities of one or a plurality of antenna systems comprising the antenna or antennas of the transmission system and the best tuner, accessory and antenna setting corresponding to those antennas, the system collects measurement data from points or subranges of the entire frequency range to be modeled and then applies a linear, nonlinear, table-driven or qualitative model to extrapolate and interpolate the proper or optimal settings for untested frequencies.

In one embodiment the system tunes to a remotely-transmitted signal and optimizes reception of that signal to optimize the configuration of the antenna tuner and other apparatus, which then also optimizes the system for later transmission under the electromagnetic principle of reciprocity. This self-adaptation is beneficial because a transmission system thereby can be configured and optimized without putting a signal on the air, which may be desirable for regulatory, health, stealth or non-interference reasons. It also is beneficial where a directional antenna system is employed and its transmission and reception direction must be jointly optimized with other variables, using a model and active mapping to self-configure. This method and system offers advantages over existing equipment that must transmit a signal to configure the equipment for a frequency and then remember it. In the disclosed system and method, the frequencies, bands, and attached tuners, accessories and antennas are proactively mapped even before the owner-user's first use.

This embodiment is especially suitable to optimization at frequencies characterized by low environmental noise (e.g. VHF and above) and where known remote transmitters are known to provide signals on a fixed frequency. The system collects the optimized tuning data comprising the frequency, antenna tuner, antenna, and other manageable settings and stores them in the model, which thereby is updated and improved. Exemplary known-station data comprise fixed-frequency broadcast stations, pre-announced transmissions on a specified frequency or range of frequencies, fixed-frequency beacons. Such station frequency data are beneficially incorporated into the system model and used to identify and select specific reception frequencies by the MPU for tuning and adjusting the antenna tuner, antenna systems, equipment selector and sequencing apparatus, and other attached or networked apparatus and systems. The frequency data model data thus may be used as an input to a tuning algorithm or heuristic, derived from sensor measurement data, and also be used once in the model for additional measurement and management purposes.

In one aspect, the system is configured to jointly map the variables of this multidimensional space. For example, because antennas are directional, signals come from a direction, and beacon locations and frequencies are fixed and known, mapping the antenna tuner using reception of beacon signals also comprises turning the antenna toward a beacon signal when seeking it on its known frequency in order to adapt the system's model of the tuner and optimize its settings for the beacon's frequency.

In an embodiment, external domain data are downloaded into the measurement and management system to permit it to adapt to changing environmental conditions. For an exemplary antenna tuner embodiment in a radio transmission system, current solar and magnetic-disturbance propagation data may be downloaded from attached or remote sources such as via the Internet. These propagation data can be used together with the computed or inferred ERP and model and measured data specifying the transmitter antenna location and its directional orientation and pattern, operating frequency, operating mode, meteorological data and corresponding model data as to operation in different meteorological conditions (e.g. wet vs. dry), and optionally geospatial map information to compute path in the presence of landmasses, water bodies, and obstructions to determine the anticipated signal strength at a specified location. Furthermore, forecasting models may be incorporated into the system to evaluate a particular transmission path under existing or predicted conditions. Alternatively, the system may communicate with a remote forecasting system to forecast, quantify and characterize a specific proposed communication, between two identified points at a particular time and data on a particular frequency. This information then may be reported to the system's user and also communicated remotely to other devices and users. In an embodiment the system is adapted to communicate this information to the user or other computers or persons via remote telecommunications means, such as via Internet, email, SMS, or RSS feed, or other publication means. The disclosed system and method beneficially provides the user answers to essential communications questions such as "How well will I be heard on this frequency at this time in that distant place with this much power and this equipment?" The measurement and management system may present these data in numerical, analog, or graphical form, and as absolute data or in reference to some standard, such as the HF maximum usable frequency (MUF), a probability of communications, or a threshold above noise floor or other noise factor or signal-to-noise standard.

The model may use the meteorological data and propagation data plus performance feedback, either provided by the owner-user or measured by the measurement and management system, applying update techniques including adaptive and reinforcement learning methods to update its own internal performance model data and improve its forecasts of communications effectiveness. For example, user feedback that communications performance under known conditions was worse than forecast by the measurement and management system can be used to tune the weight of an adaptive network mathematical model, to define a mathematical separatrix identifying different subregions of a performance space in a mathematical model, or to create a symbolic-representation record which can be reasoned about and stored as annotations for later explanation of system behavior.

It will be appreciated that the application to a transmission system comprising a radio transmitter here and throughout these disclosures is exemplary and not limiting. All other forms of external measureable or manageable apparatus are also intended in these disclosures. For example and without limitation, these methods and systems for measurement and management also are disclosed here as to electronic audio apparatus, wired and wireless systems, optical systems, systems with mechanical and/or electromechanical components, measurable and/or manageable appliances, utility power systems, automotive electronics systems, avionics systems, robotic systems, toys, metronomes and musical apparatus, all forms of radios and televisions, personal computers and peripherals, kitchen and laundry equipment, electric lock systems, lighting system components, building alarm system and security sensors and effectors, garage door openers and garage/storage space sensors, irrigation system components, meteorological sensor and reporting components, game consoles and their sensors/effectors, audiovisual projectors, microphones and loudspeakers and other acoustic reproduction components, electrical vacuum cleaners and sweepers and other cleaning components, electrical controls for gas fireplaces, electrical toys, electrically driven or remote-control vehicles/aircraft/vessels whether on air/land/sea, photography apparatus, test equipment, computer numerically controlled (CNC) and other manufacturing equipment, and other measurable and manageable systems without limitation.

Cognitive User Interface Organization of Measurement and Management Systems

Figure 4:
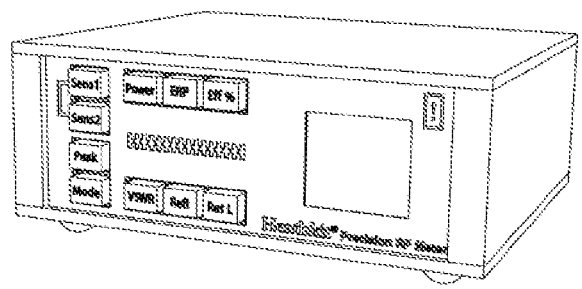
FIG. 4 is a drawing of an exemplary embodiment of the measurement and management system for RF power analysis, depicted assembled.
Figure 4A:
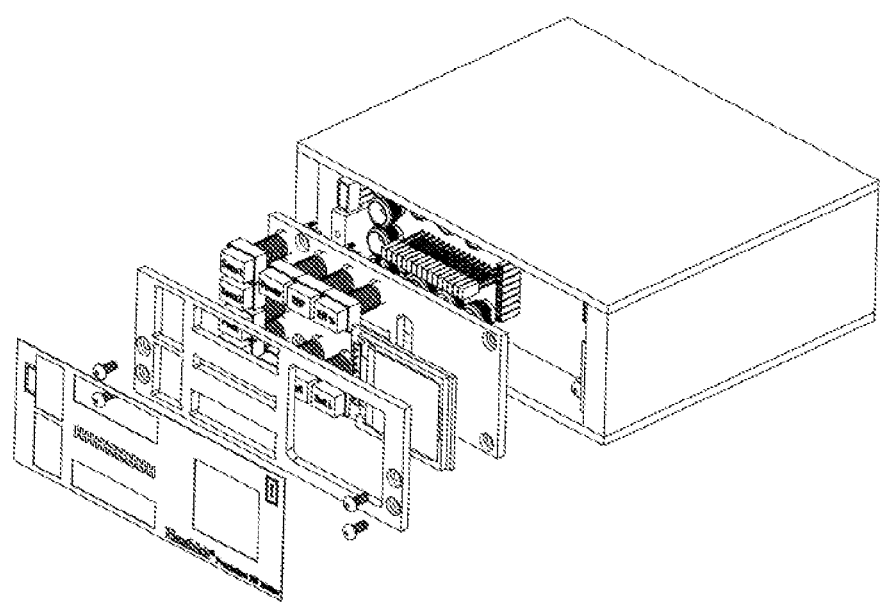
FIG. 4A is a drawing of an exemplary embodiment of the measurement and management system for RF power analysis as an exploded diagram, depicted with bargraph LEDs installed.
Figure 4B:
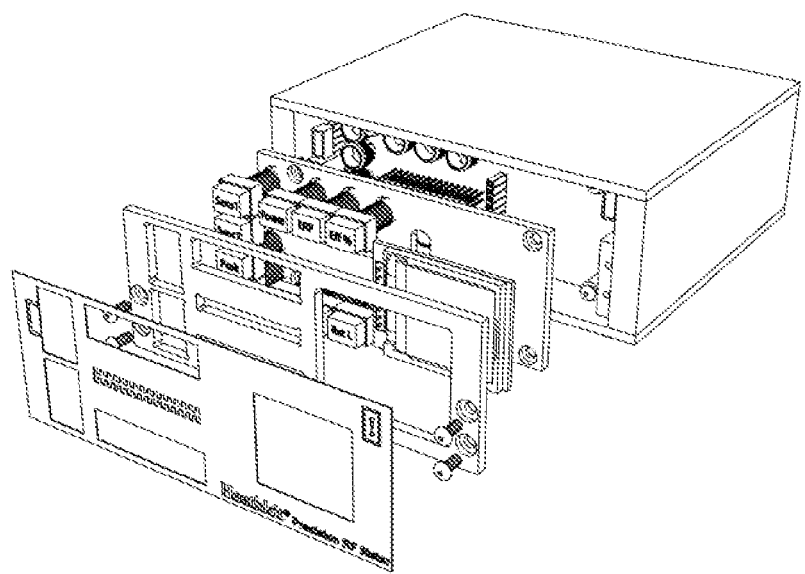
FIG. 4B is an alternative drawing of an exemplary embodiment of the measurement and management system for RF power analysis as an exploded diagram, depicted with bargraph LEDs installed.
Figure 4C:
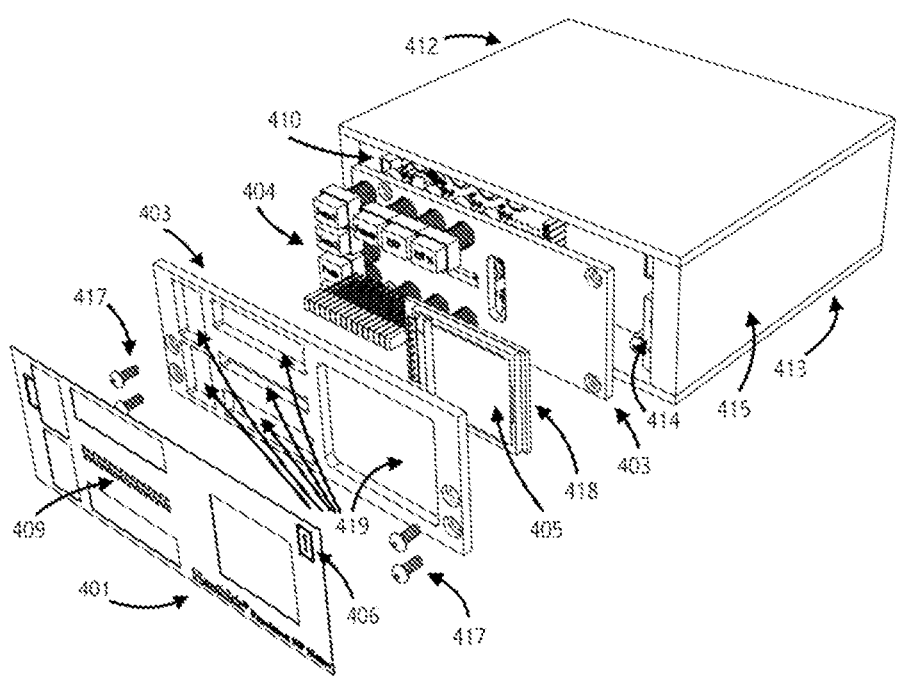
FIG. 4C is an alternative drawing of an exemplary embodiment of the measurement and management system for RF power analysis as an exploded diagram, depicted with bargraph LEDs exploded out, before their insertion through subpanel and PCB, alignment with subpanel, and attachment to PCB.
Figure 5:
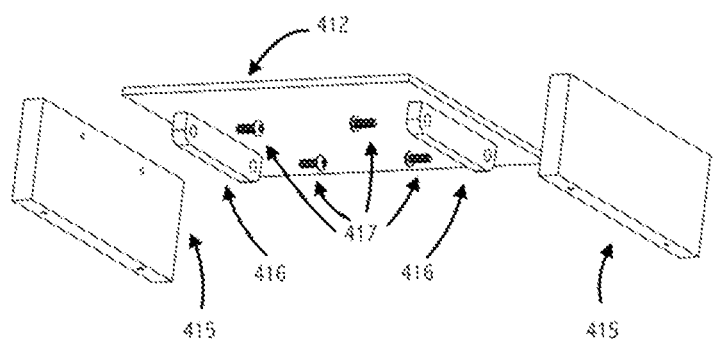
FIG. 5 is a drawing of an exemplary embodiment of the top panel with welded mounting tabs, screws, and sides as an exploded diagram before assembly.
Figure 6:
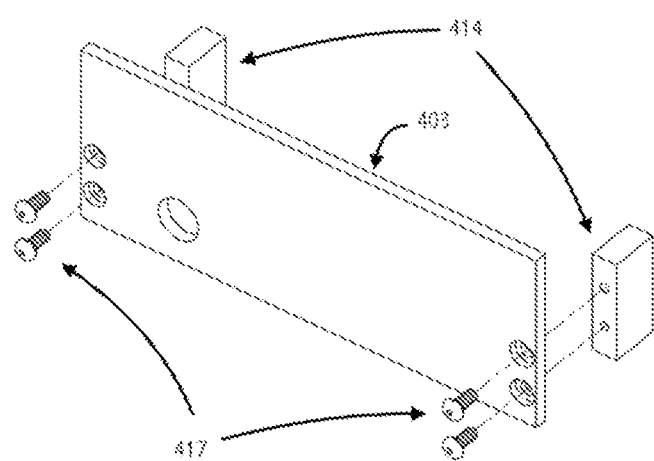
FIG. 6 is a drawing of an exemplary embodiment of a counterbored front subpanel, rectangular solid drilled and tapped anchors, and screws, as an exploded diagram before assembly.
Figure 7:
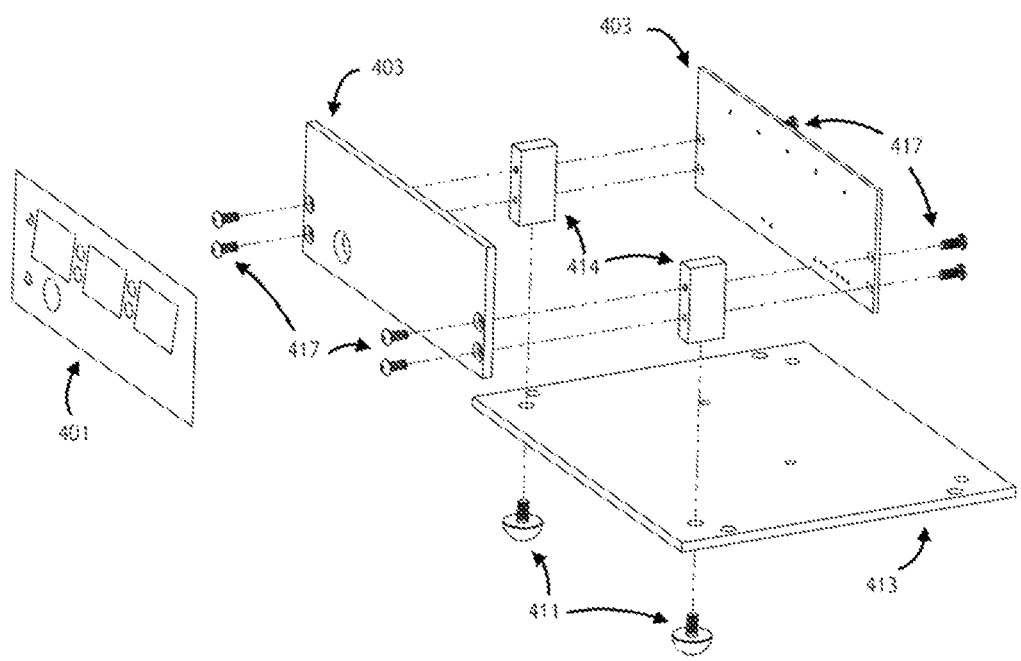
FIG. 7 is a drawing of an exemplary embodiment of a counterbored front subpanel, rear subpanel, rectangular solid drilled and tapped anchors, screws, graphic overlay, cabinet bottom panel, and threaded feet, as an exploded diagram before assembly.
Figure 8:
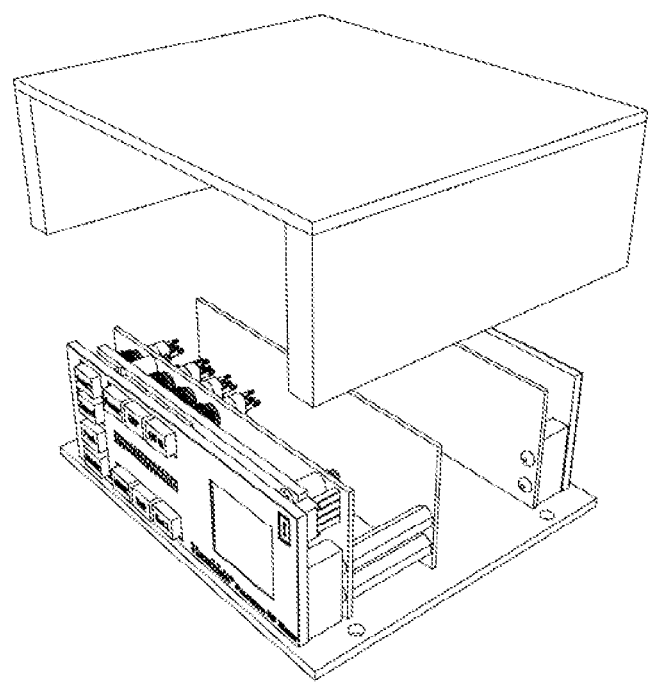
FIG. 8 is a drawing of an exemplary embodiment of subpanels, anchors, bottom panel, and multiple PCBs including standoff attachments from anchors, as one subassembly, and a second top, tabs, and side subassembly, as an exploded diagram before final cabinet assembly.

FIG. 1 illustrates an exemplary embodiment of the measurement and management system for RF power analysis, depicted assembled. FIG. 4A illustrates an exemplary embodiment of the measurement and management system for RF power analysis as an exploded diagram, depicted with bargraph LEDs installed. FIG. 4B illustrates an alternative view of an exemplary embodiment of the measurement and management system for RF power analysis as an exploded diagram, depicted with bargraph LEDs installed. FIG. 4C illustrates an alternative view of an exemplary embodiment of the measurement and management system for RF power analysis as an exploded diagram, depicted with bargraph LEDs exploded out, before their insertion through the subpanel and PCB, alignment with a subpanel, and attachment to a PCB.

In one exemplary embodiment, a graphic overlay 401 is positioned over a row of rectangular LEDs 402 and attached over a structural subpanel or plurality of subpanels 403 that provide support for and organize controls and buttons 404, display meters 405, indicators 406, and other user interaction components. A graphic overlay can be embodied as a very thin piece or sheet of plastic imprinted or marked with graphics such as may provide indications for an equipment panel, often comprising multiple structural and graphic layers, with an adhesive side attachable to a subpanel. The graphic overlay of this disclosure beneficially embodies a bargraph 407 that simultaneously displays analog and digital information. To display analog data, the graphic overlay contains a linear or curvilinear continuous clear or translucent transmissive region 408 situated over all the LEDs, such that when LEDs are illuminated they constructively appear to a viewer at least in part as a solid bar of light. To simultaneously display digital data, a reticle 409 (sometimes also known as a "reticule" or "graticule") is masked onto the graphic overlay 401 also situated over at least part of the LEDs. In an embodiment, the reticle permits a viewer to distinguish each LED and thus be able to count the number of LEDs that are lit.

In an embodiment, a mounting system for assembly comprises one or a plurality of graphic overlays 401, one or a plurality of subpanels 403, one or more PCBs 410, cabinet feet 411, and a cabinet comprising top 412 and bottom 413 plates, anchors 414, sides 415, and tabs 416 with associated mounting hardware 417. The precision anchor and tab design beneficially achieves precise alignment of the cognitive interface with the internals and further permits an owner-user, rather than a manufacturer's factory, to assemble, test, maintain, and modify the equipment and to gain routine access to its internals for purposes including initial calibration and recalibration to maintain the highest accuracy. The outermost subpanel comprises precision-counterbored subpanel holes into which the head of a screw can fit entirely when its threaded shaft is inserted through the hole centered in the counterbore, such that the graphic overlay once applied to the subpanel covers the counterbores and screw heads to create a smooth continuous surface. The feet 411 attach through the bottom 413 of the cabinet to corresponding threaded holes in the anchors 414. In one embodiment the one or more PCBs 410 also are attached to the anchors 414, thereby securing the PCBs within the cabinet. In one embodiment, additional PCBs may be attached to the first PCB using standoffs 417, thus stably positioning them in precise location due to the precision of the anchor assembly. In an embodiment, there are a plurality of PCBs, one PCB comprises display electronics 418, and the display electronics PCB is secured so as to position its LEDs and graphical display panel components against and into corresponding spaces or slots 419 cut into a subpanel 403, thereby securing and positioning the electronic display components of the system in precise, stable, and correct alignment with corresponding transmissive regions and markings on the graphic overlay 401. In an embodiment, the tabs 416 and top 412 are chemically weldable plastic and the tabs are precisely positioned and welded to the top 412. In an embodiment, the sides 415 are a compliant or accepting material such as wood, the tabs 416 are mounted perpendicularly to the interior surface of the top plate 412, and screws 417 are passed through holes in the tabs and screwed into corresponding threaded holes in the wood sides to form a stable and robust top-and-sides assembly having no exterior screw heads or other visible attachment hardware. In this embodiment the wood beneficially acts as a binding nut so as to create an assembly that does not loosen over time and does not require additional lock washers or other retaining hardware. In an embodiment the anchors 414 are rectangular solids comprised of plastic with holes drilled or tapped in them in correspondence with the subpanel, foot, and PCB screws 417 to be inserted into and attached to the anchors, such that precise alignment of all attached components is achieved when the screws are inserted. In an embodiment, a jig positions the top and tabs in a precise three-dimensional relation and holds them while they are chemically welded to produce the top-and-tabs assembly that is attachable to the sides, which in one embodiment are wood.

In one embodiment, thin reticle marks 409 are precisely positioned at or over at least part of the intersection or adjacency point of adjacent LEDs 402 comprising a bargraph, thereby defining a boundary and distinguishing them from each other. In an embodiment, not all reticle marks between adjacent LEDs are present, allowing multiple adjacent LEDs to appear as one measurable unit. In an embodiment, more than one reticle is overlaid over the LEDs to permit different groups of adjacent LEDs or sizes of lit region to be designated according to different units. In one embodiment, the set of LEDs comprises different LEDs of different colors. In an embodiment, adjacent subgroups of LEDs are of the same color and color is meaningfully assigned to each group such as according to perceptual or cognitive criteria having meaning to a user or viewer. In an exemplary embodiment, the sequence of LEDs comprises successively a group of immediately adjacent rectangular green, yellow, orange, and red LEDs tightly packed to form the appearance of a solid bar of light having varying color subregions along its length. The color thus progresses from a cognitive "low" to "high" or even "good" to "bad" or "less" to "more" by virtue of the color arrangement, where color redundantly encodes degree in correspondence with lit length of the LED bargraph. Because the LEDs are tightly adjacently packed, this provides the illusion of a single multicolor bar of light. However, a reticle masked at least partly over the LEDs such as from above permits also the user to distinguish individual LEDs and thus count them. The one or plurality of MPUs within the meter or control head then comprise an assignment of cognitive meaning to the individual bars and the bar color groups. In an embodiment, the assignment of cognitive meaning corresponds to express model data characterizing measurement or management states of the apparatus or the system it measures and manages. In one exemplary embodiment, each bar may represent a fixed increment of change or step size, such as an increase in the measured quantity one dB or 3 dB. In an alternative exemplary embodiment, the measurement step size implied by one reticle unit is variable by color group, so that for example lighting each successive green LED indicates one step size, such as 1 dB, but lighting each yellow LED represents a different, larger step size such as 3 dB. In an embodiment, the break point from one color to the next is associated with cognitively meaningful changes in the operation of the system to which the sensors of the measurement and management system are attached. For example, if the sensors are attached to a radio transmitter and associated antenna system including feedlines and other apparatus, then when measuring SWR (or equivalently, Return Loss) the color may remain green (only green LEDs of the bargraph will be lit) as long as the SWR is in a range deemed safe, with yellow and orange indicating increasing danger of SWR mismatch seen by the transmitter, and red indicating a high danger condition. When measuring power, the color breaks are meaningfully assigned to correspond to regulatory limitations on permissible power, changes in power class relevant to typical use of the equipment, and/or safety or design limitations on use of the equipment. In an embodiment, each color group may represent regulatory conditions known to the MPU by virtue of the model it comprises. For example, the break point from each color to the next may represent the regulatory limits on permissible legal transmission power corresponding to specific frequencies, bands and subbands, modes of operation, license classes and types, and licensee privileges. In an embodiment the groups are adapted as required, such as through nonlinearity in step size, to accommodate and guarantee cognitively meaningful break points when each next color group is lit, in correspondence with the internal model of the system.

In an embodiment, in addition to reticle graphic markings the graphic overlay masking comprises numerical and textual markings that identify measured or managed units such as dB, dBm, dBi, dBd, watts, or Hertz (Hz) and also indicate the user state or "mode" selections, whether made remotely such as via network connection to remote systems or locally by a user. In an embodiment, the model data are used to only permit meaningful units to be lit, displayed, or communicated according to the operating mode of the equipment and the selections and workflow of the user.

A second reticle can be beneficially superimposed over the LEDs, such as from the bottom, that identifies and delineates different subgroups. In one exemplary embodiment, one reticle may indicate one system of units and the second may indicate another alternative system of units, such as watts and dBm. In an embodiment, the different reticles respectively express measures in units vs. unitless measure, such as power vs. SWR. In an alternative embodiment, one reticle may provide for higher-resolution separation of individual LEDs so they may be counted, and a second reticle may permit cognitively meaningful groups or clusters of lit LEDs to be easily identified, such as may represent a larger step size. In an embodiment, one reticle may indicate measurement, and another management. For example, a first reticle may contain graduations that represent units of measurement derived from the sensor data, and a second reticle may indicate successive or non-successive steps at which an action will be or has been taken by the measurement and management system.

Although the bargraph naturally presents as a single continuum, it also may be used beneficially in a discontinuous manner. In one exemplary embodiment, the left side of the bargraph is assigned one meaning and the right side is assigned a different meaning, and each such segment may be lit by the MPU independent of the other to indicate a condition, degree of measurement, or action taken. Different groups of LEDs comprising the bargraph thus may be assigned different cognitive meaning in the workflow of the user. These are controlled by the MPU of the display component, such as through direct connection to its input-output pins or indirect connection via a display driver chip.

In one aspect, selector buttons 404 are grouped according to a related cognitively meaningful function in the user's measurement and management workflow. In an exemplary embodiment, the sensor selector buttons are grouped and adjacent. In an embodiment, sensor buttons may be depressed or otherwise selected simultaneously to invoke a grouping method, wherein the meter or control head senses and records that a computation or inference relating the two sensors is to be performed, such as an efficiency computation measuring the power ratio of the second to the first sensor. When the two sensors are thus jointly selected or linked, a graphical bracket or other link graphic depicting their relationship in the present workflow correspondingly is backlit in the graphic overlay showing the two buttons joined. This effect is achieved for any number or combination of buttons by virtue of backlit bracketing or grouping link graphic indicators, by use of different colors of light that redundantly or selectively identify pairings or larger groupings of buttons or other panel or graphic-display indicators, or by combinations thereof, and is applicable to groupings of sensors and/or of other buttons indicative of their corresponding cognitive linkage in a workflow function. In an embodiment, buttons selecting among forward power, ERP, and efficiency are in one physical grouping, comprising a group corresponding to the cognitive task of selecting from among different model-based measurement and viewing objectives for emitted or radiated power in a transmission system. Buttons selecting among VSWR, reflected power, and return loss are grouped together, comprising a group corresponding to the workflow task of selecting from among different cognitive models of measuring and understanding power that is not radiated. A Peak button permits selection of different peak, average, and RMS values and also enables or disables a peak-remembering function. In one embodiment, the Peak button may be repeatedly selected to cycle through different peak, RMS, average, and other modes of power measurement, and may be long-pressed to select or disable the peak-remembering function. The MPU correspondingly senses the button presses, measures the length of button depression or selection, and selects accordingly from among the multiple meanings (cycle peak type vs. peak-remember) associated with the single control. The peak-remembering function computes and retains the maximum value of the measured quantity such as forward power or efficiency, and also "pegs" the highest-lit LED in the bargraph while allowing other LEDs to be lit and unlit as power varies, thus displaying the highest value reached. In an embodiment, a decay value is applied to the peak-remembering function to allow the peak value to expire and be erased and replaced by the MPU with a new peak value. In an embodiment the user configures the value of the decay, which may be any of a scalar, a formula, a rule, or a computable procedure. The decay value also is beneficially applied to the waveform recording function to permit it to be replaced and renewed to show a more recently seen waveform shape. In an alternative embodiment, separate decay values, formulas, rules, or procedures are used and may be configured.

In measurement and management equipment such as an integrated antenna tuner where at least some management functions are not automated and must be performed by the owner-user, such as non-motorized antenna tuners comprising SWR and power meters and corresponding sensors, a cognitively improved display method and system further is disclosed comprising indicators positioned over the tunable controls indicating visually the direction to tune the control for a better match, showing data determined using the measured state and internal model. In an exemplary embodiment, half-circular arrows or arcs comprising LEDs arranged as for the bargraph are lit to show both the next control to tune and the recommended direction in which to tune it. This may be determined by reference to the stored model data relating transmitter frequency and tuning configuration. In current art, the user must "chase the needle" and wander back and forth tuning to find the right match. By virtue of the disclosed internal model, the tuner can present graphical data that advise the owner-user in which direction to tune for best match. The data used to light the appropriate indicator arc can be determined via interpolation or extrapolation from existing known data to estimate unknown/untested matches, or based on computations performed from a circuit analysis of the circuit and the operating frequency, or based on prior or updated/downloadable guidance knowledge provided in the measurement and management system. Alternative models and representations may inferred from the collected data, e.g. a parameterized-curve model of the data may be developed from the measured match data and stored together with the actual measurement data, or can be used to select from among a family of predefined curves. In an alternative embodiment, non-graphical data may be used to communicate the advice as to best adjustment of the measurement and management equipment, such as speech, audio tone, tactile, or textual.

In one embodiment, one or a plurality of alert indicators communicate a range of cognitively relevant conditions to the owner-user, locally or remotely. We disclose alerts that may be defined for any condition or combination of conditions related to any of the measurements, the model knowledge including both rules and data, the presence or absence of procedures in software or firmware, and the physical model of the external system such as the transmission system of an exemplary model. In one exemplary embodiment of a measurement and management system comprising a model of a transmission system including its geographic location near real property boundaries, a model of applicable government regulations, the frequency of transmission, the antenna physics, and the system-determined ERP, an alert can be sounded when the electromagnetic field strength of the transmitted signal according to the model will exceed the legally-permissible radiation energy level receivable at or impinging on a neighboring property. The alert status further can be queried by the owner-user for the root cause, and the annotation functionality within the internal model of the system can be used to provide a human-compatible reason for the alert, either in some graphical or indicator format and by speech output, viz. "Your transmitted signal exceeds federal regulations on this frequency for radiated energy at 28.3 MHz using this antenna. You may switch to antenna 2 to reduce your transmissions to a legally acceptable level, or reduce your power level to below 25 watts."

In an embodiment, a map of beacon radio transmitters is provided for in the model of the measurement and management system, comprising geographic data, frequencies, transmission times and protocols, and other published or observed data. In an embodiment, the system comprises beacon and active or recently-seen station data such as are published on and downloadable into the system from the Internet, which subsequently are augmented allows the antenna tuner to pre-configure itself using an attached or internal receiver. The system alerts further when a signal was not being received but now is, indicating a band opening and the possibility of communications. Alert status is displayed on or announced at a meter display, transmitted to attached or networked systems, or a combination thereof.

In an embodiment, the system generates an external report to satisfy regulatory requirements as to ERP, power, and other regulated measures, and also its internal log data. Log data may include internal system status, configuration and change data, and event data. In an exemplary embodiment applied to radio transmission, events elated to on-air station activity may be logged, including in standard log formats for subsequent use for contest, regulatory, and other external purposes.

The described embodiments of the invention are intended to be exemplary and numerous variations and modifications will be apparent to those skilled in the art. Additional embodiments are described in the attached Appendix, which is incorporated into this Specification for all that it teaches. All such variations and modifications are intended to be within the scope of the present invention as defined in the appended claims. Although the present invention has been described and illustrated in detail, it is to be clearly understood that the same is by way of illustration and example only, and is not to be taken by way of limitation. It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable combination. It is appreciated that the particular embodiment described in the Appendix is intended only to provide an extremely detailed disclosure of one embodiment of the present invention and is not intended to be limiting.

Combination of all these methods and apparatus also are intended and hereby disclosed.

What is claimed is:

1. A model-based measurement and management system, comprising at least one model incorporated in an electronic system for measurement and management using a computable knowledge representation selected from the group consisting of one or a plurality of linear equations expressed in computable form, and one or a plurality of nonlinear simultaneous differential equations; wherein components of a system to be modeled are represented by variables of the model, and behavior of the system to be modeled is represented by coefficients of the variables of the model; wherein the computable knowledge representation of the model is implemented in composite data structures; wherein the model is configured to permit at least one of question-answering, interpolation with high accuracy, behavior forecasting, error analysis, failure prediction, limit determination for a method or system, cost function computation, augmentation over time of express model knowledge within the system intrinsically or extrinsically, adherence to regulatory limitations, and transmitting, receiving and reporting status and component or system capabilities to attached, remote, or networked systems and devices.

2. The system of claim 1, where the express model knowledge is further computably compiled for efficient storage and use.

3. The system of claim 1, where the model comprises a declarative knowledge representation.

4. The system of claim 1, where the model comprises a procedural knowledge representation.

5. The system of claim 1, where the system is configured to transmit its model data to or receive its model data from another model-based measurement and management system.

6. The system of claim 1, where the system comprises at least one microprocessor operably programmed to contain express model data structures configurable to represent a structure and relationship of the various components of the system of which the at least one microprocessor is a part.

7. The system of claim 1, where said system is a first system comprising at least one microprocessor operably programmed to contain express model data as to a structure and relationship of components of at least one second system or device to which the first system is operably attached, networked or connected.

8. The system of claim 1, where the system is configured to contain performance or operation model data about a domain of at least one second system or device to which the first system is operably attached, networked or connected.

9. The system of claim 1, wherein the composite data structures are selected from the group consisting of vector data objects and multidimensional array objects.

10. A measurement and management system for assembly comprising one or a plurality of graphic overlays, one or a plurality of subpanels, one or more printed circuit boards (PCBs), cabinet feet, and a cabinet comprising top and bottom plates, anchors, sides, and tabs with associated mounting hardware.

11. The system of claim 10, wherein the anchors and tabs are precision anchors and precision tabs that achieve precise alignment of a cognitive interface with internal contents of the system, thereby permitting an owner-user to assemble, test, maintain, and modify the equipment and to gain routine access to the internal contents of the system for purposes including initial calibration or recalibration to achieve or maintain a desired accuracy.

12. A measurement and management system for assembly comprising one or a plurality of graphic overlays, one or a plurality of subpanels, one or more printed circuit boards (PCBs), cabinet feet, and a cabinet comprising top and bottom plates, precision anchors, sides, and precision tabs with associated mounting hardware that permits an owner-user to perform initial calibration or recalibration to achieve or maintain a desired accuracy and to configure and reconfigure the system through either local or remote means.

* * * * *